(12) United States Patent
Balucani

(10) Patent No.: US 8,435,044 B2
(45) Date of Patent: May 7, 2013

(54) ELASTIC CONTACT DEVICE FOR ELECTRONIC COMPONENTS WITH BUCKLING COLUMNS

(75) Inventor: Marco Balucani, Montesilvano (IT)

(73) Assignee: Rise Technology S.r.l., Pomezia (IT)

( * ) Notice: Subject to any disclaimer, the term of this patent is extended or adjusted under 35 U.S.C. 154(b) by 0 days.

(21) Appl. No.: 13/145,484

(22) PCT Filed: Jan. 20, 2010

(86) PCT No.: PCT/IB2010/000098
§ 371 (c)(1),
(2), (4) Date: Oct. 7, 2011

(87) PCT Pub. No.: WO2010/084405
PCT Pub. Date: Jul. 29, 2010

(65) Prior Publication Data
US 2012/0071037 A1    Mar. 22, 2012

(30) Foreign Application Priority Data
Jan. 20, 2009   (IT) .............................. MI2009A0050

(51) Int. Cl.
*H01R 12/00*    (2006.01)

(52) U.S. Cl.
USPC ........................................................ 439/66

(58) Field of Classification Search ............... 439/66, 439/83, 70–74, 68, 886
See application file for complete search history.

(56) References Cited

U.S. PATENT DOCUMENTS

| | | | |
|---|---|---|---|
| 4,820,376 A | 4/1989 | Lambert et al. | |
| 4,998,885 A | 3/1991 | Beaman | |
| 5,174,763 A | 12/1992 | Wilson | |
| 5,334,029 A | 8/1994 | Akkapeddi et al. | |
| 5,367,254 A | 11/1994 | Faure et al. | |

(Continued)

FOREIGN PATENT DOCUMENTS

| | | |
|---|---|---|
| WO | 9504447 | 2/1995 |
| WO | 9841877 | 9/1998 |
| WO | 2006066620 | 6/2006 |
| WO | 2007104799 | 9/2007 |

OTHER PUBLICATIONS

International Search Report for International Application No. PCT/IB2010/000098, European Patent Office, May 18, 2010, pp. 5.

(Continued)

*Primary Examiner* — Tulsidas C Patel
*Assistant Examiner* — Phuongchi Nguyen
(74) *Attorney, Agent, or Firm* — Graybeal Jackson LLP; Kevin D. Jablonski

(57) ABSTRACT

An embodiment of an elastic contact device for electrically contacting electronic components is proposed. The contact device includes at least one basic module with a longitudinal axis, each one including an elastic core for defining an elasticity of the basic module (undergoing an axial elastic deformation in response to an axial compression), a first contact terminal element and a second contact terminal element coupled with the elastic core in axially opposed positions, and at least one elongated contact element extending axially between the first and second terminal elements, wherein each elongated element is configured to have a buckling axial critical load higher than zero for self-sustaining in absence of external forces during a production of the basic module and lower than a threshold compression (ranging approximately between 0.1% and 50%) for buckling thereby not contributing to the elasticity of the basic module during operation thereof.

18 Claims, 27 Drawing Sheets

U.S. PATENT DOCUMENTS

| | | | |
|---|---|---|---|
| 5,385,477 A * | 1/1995 | Vaynkof et al. | 439/66 |
| 5,403,194 A * | 4/1995 | Yamazaki | 439/66 |
| 5,427,535 A * | 6/1995 | Sinclair | 439/66 |
| 5,904,580 A * | 5/1999 | Kozel et al. | 439/66 |
| 6,079,987 A | 6/2000 | Matsunaga et al. | |
| 6,264,476 B1 | 7/2001 | Li et al. | |
| 6,796,810 B2 | 9/2004 | DelPrete et al. | |
| 2002/0053734 A1 | 5/2002 | Eldridge et al. | |
| 2002/0060579 A1 | 5/2002 | Haseyama et al. | |
| 2002/0086566 A1 | 7/2002 | Simons | |
| 2005/0012221 A1 | 1/2005 | Kirby et al. | |
| 2006/0145719 A1 | 7/2006 | Jeong et al. | |
| 2006/0279943 A1 | 12/2006 | Akram et al. | |

OTHER PUBLICATIONS

V. Lehmann, U. Gruning, "The limits of macropore array fabrication", Elsevier Science SA, Thin Solid Films 297 (1997) 13-17.

F. Marty, L. Rousseau, B. Saadany, B. Mercier, O. Francais, Y. Mita, T. Bourouina, "Advanced etching of silicon based on deep reactive ion etching for silicon high aspect ratio microstructures and three-dimensional micro- and nanostructures", Elsevier, Microelectronics Journal 36 (2005) 673-677.

Woo Lee, Ran Ji, Ulrich Gosele, and Kornelius Nielsch, "Fast fabrication of long-range ordered porous alumina membranes by hard anodization", 2006 Nature PublishingGroup, Nature Materials, vol. 5, Sep. 2006, www.nature.com/naturematerials, pp. 7.

V. Lehmann, and S. Rönnebeck, "The Physics of Macropore Formation in Low-Doped p-Type Silicon", Journal of The Electrochemical Society, 146 (8) 2968-2975 (1999).

Sandra Lust and Claude Levy-Clement, "Chemical Limitations of Macropore Formation on Medium-Doped p-Type Silicon", Journal of The Electrochemical Society, 149 (6) C338-C344 (2002).

H. Foll, M. Christophersen, J. Carstensen, G. Hasse, "Formation and application of porous silicon", Materials Science and Engineering R 39 (2002) 93-141.

Shoso Shingubara, "Fabrication of nanomaterials using porous alumina templates", Journal of Nanoparticle Research 5: 17-30, 2003. 2003 Kluwer Academic Publishers. Printed in the Netherlands.

Yukio H. Ogata, Katsutoshi Kobayashi, Munekazu Motoyama, "Electrochemical metal deposition on silicon", Current Opinion in Solid State and Materials Science 10 (2006) 163-172.

N. Mikia, X. Zhang, R. Khanna, A.A. Ayon, D. Ward, S.M. Spearing, "Multi-stack silicon-direct wafer bonding for 3D MEMS manufacturing", Elsevier Science B.V., Sensors and Actuators A 103 (2003) 194-201.

* cited by examiner

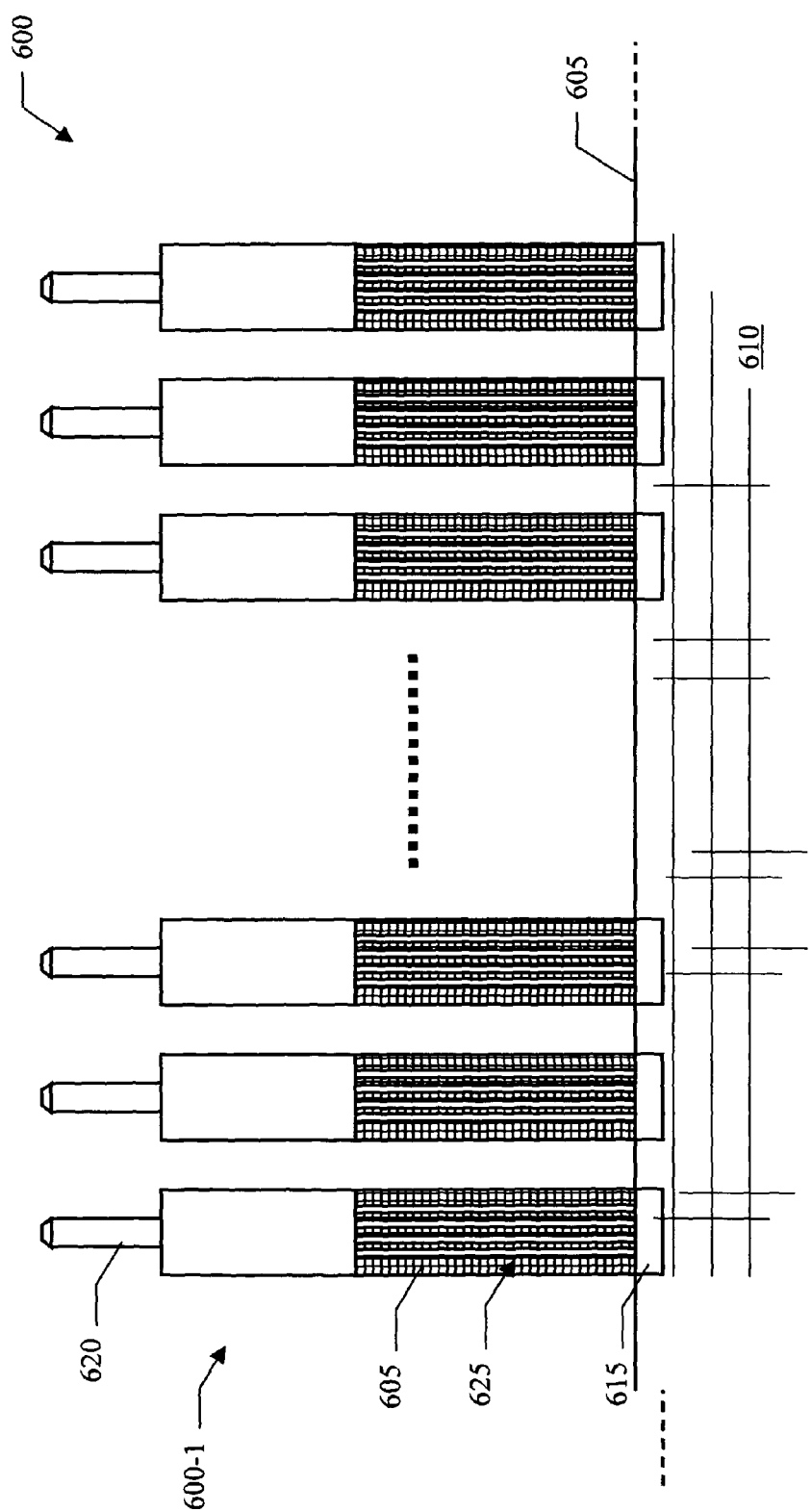

ELASTIC CONTACT DEVICE FOR ELECTRONIC COMPONENTS WITH BUCKLING COLUMNS

PRIORITY CLAIM

The present application is a national phase application filed pursuant to 35 USC §371 of International Patent Application Serial No. PCT/IB2010/000098, filed Jan. 20, 2010, which further claims the benefit of Italian Patent Application Serial No. MI2009A000050 filed Jan. 20, 2009; all of the foregoing applications are incorporated herein by reference in their entireties.

TECHNICAL FIELD

An embodiment relates to the electronics field. More specifically, an embodiment relates to the electrical contacting of electronic components.

BACKGROUND

Any electronic component needs to be contacted electrically for its operation; in some cases, moreover, it may be preferable that this contacting should occur in an elastic way.

A typical example is that of sockets that are used for contacting electronic components during their test at the package level; another example is that of probe cards, which are used for contacting electronic components during their test at the wafer level. In both cases, the electronic components to be tested are contacted in an elastic way to avoid their damaging. An elastic structure may also be required to electrically connect a chip of semiconductor material (wherein an electronic component is integrated) to a circuitized substrate of a corresponding package—for example, in the flip-chip technique—in order to reduce mechanical stresses between the chip and the substrate. The same necessity may occur when it is required to electrically connect different electronic components in a Multi-Chip Module (MCM), and in power components on DCB (Direct Copper Bonding) plates.

For this purpose, several electrical contact devices (or simply contacts) of the elastic type have been proposed.

Particularly, contacts being known as "pogo-pins" are commonly used in the sockets and in the probe cards. In general, the pogo-pins are formed by metallic springs or polymeric elements that are made conductive by embedding suitable metallic particles—for example, as described in document US-A-2006/0145719 (the entire disclosure of which is herein incorporated by reference).

However, the spring-based contacts are relatively cumbersome and therefore they do not allow obtaining structures with reduced pitch. Indeed, the springs have a minimum working length, being defined by the maximum deformation that allows maintaining their elastic properties, which is rather limited (for example, hardly higher than 60% of their resting length); therefore, the springs should be maintained relatively long to allow a deformation that provides acceptable values of a reaction force in response to a corresponding compression force. Moreover, the springs exhibit a direct proportionality between the (compression/reaction) force and the deformation; this may be a drawback in some applications (for example, in the probe cards and in the sockets). Indeed, in order to obtain a correct electrical contact with the electronic components (of the wafer or of the package) to be tested, each contact should provide a nominal reaction force being due by a corresponding nominal deformation. Generally, the probe cards and the sockets include a very high number of contacts (of the order of some thousands), so that it is not possible to ensure that all the contacts reach the wafer or the package, respectively, at the same time (because of an unavoidable planarity error). Consequently, it may be necessary to apply a compression force that allows moving the contacts closer by a distance that is higher than the one being needed to obtain the nominal deformation at least of the expected planarity error (in order to guarantee that all the contacts undergo the nominal deformation). However, the proportionality between the deformation and the force causes the reaction force being exerted by the first contacts that reach the nominal deformation to be remarkably increased (because of their additional deformation), with the risk of possible damages to such contacts; moreover, this may require a significant increase of the compression force to be applied to the probe cards or to the sockets (in order to overcome the additional reaction force being exerted by the contacts that first reach the wafer or the package, respectively).

The conductive polymer-based contacts, instead, have a reduced working life (because of the structural modifications that are caused in the polymer by the added metallic particles); in any case, the need of adding high amounts of metallic particles to the polymer for obtaining an acceptable conductivity (even higher than 50% in volume) considerably limits the possibility of controlling its mechanical characteristics—thereby making very difficult, if not impossible, to obtain the desired elasticity.

The same drawbacks pointed out above for the spring-based contacts are also suffered by the structure being described in document U.S. Pat. No. 6,796,810 (the entire disclosure of which is herein incorporated by reference). Indeed, in this case there is proposed to use elastic conductive columns, which are surrounded by an insulating material.

Alternatively, document US-A-2002/0086566 (the entire disclosure of which is herein incorporated by reference) proposes using an elastic polymeric element that embeds an electric conductor at the liquid state. However, this structure is difficult to make, requires non-standard dedicated processes, and it is limited by the need of using conductive materials that are liquid at the normal working temperatures of the contacts.

Another possibility is described in document U.S. Pat. No. 4,820,376 (the entire disclosure of which is herein incorporated by reference), which proposes embedding a column of conductive particles into an elastic polymeric element. A drawback of this structure is that the electrical conductivity is not fixed, but it changes with the compression force that is applied thereto.

A different contact structure for probe cards is described in document U.S. Pat. No. 5,367,254 (the entire disclosure of which is herein incorporated by reference). This document proposes using a conductive wire, which is housed within a rigid guide with recesses that are staggered to each other longitudinally (with every pair of adjacent recesses that are arranged in radially opposed positions); the wire is free to slide along the guide, with an end that is fastened to the guide and another end that protrudes therefrom. In this way, when a load is applied to the protruding end of the wire, it buckles (collapses) thereby re-entering the guide; the proposed structure of the guide allows controlling the deformation of the wire, so as to ensure that it returns to its original position when the load is removed. However, the electrical contact so obtained is remarkably unstable.

Another structure being based on the buckling of conductive wires is described in document WOA-95/04447 (the entire disclosure of which is herein incorporated by reference). In this case, the buckling conductive wires transversally deform an elastic polymeric element (which maintains the conductive wires insulated, and controls their deformation by means of rigid inserts). In this way, the axial reaction force is provided by the conductive wires, while the polymeric element does not undergo any axial compression (because of the presence of a corresponding rigid mechanical constraint). Therefore, the conductive wires are subject to a remarkable mechanical fatigue (with the same document that cites an alternative wherein it is possible to replace the conductive wires that break because of the undergone fatigue).

In the packages, instead, contacts of the elastic type between the chip and the substrate may be made with compliant bumps, wherein the bumps are mounted on microsprings. This structure is however relatively complex and cumbersome, and it suffers from the same drawbacks being pointed out above for the spring-based pogo-pins. Alternatively, contacts of the rigid type are often used; in this case, once the chip has been soldered to the substrate, an elastic under-filling layer is then added between the substrate and the chip.

Another contact structure of the elastic type (for use in sockets, probe cards, packages and multi-chip modules) is described in document WO-A-2006/066620 (the entire disclosure of which is herein incorporated by reference). In this case, the contact is formed by an elastic polymeric core (being either conductive or insulating), which is coated by a metallic cover with a pyramidal or truncated pyramidal shape.

Conductive wire-based contacts are also known; this structure is generally used to make elastic interposers, which are formed by a polymeric layer that sustains wires being embedded therein—for example, as described in document U.S. Pat. No. 5,334,029 (the entire disclosure of which is herein incorporated by reference).

Another example of interposer is described in document U.S. Pat. No. 4,998,885 (the entire disclosure of which is herein incorporated by reference), with a similar layer that mechanically sustains conductive wires thereby insulating them electrically. In this case, notches are made in the polymeric layer between the different conductive wires, which notches are used (according to their size and spacing) to control the compression uniformity of the structure.

The document U.S. Pat. No. 6,264,476 (the entire disclosure of which is herein incorporated by reference) describes a different type of interposer, wherein each contact includes a conductive element being formed by a spring (which contributes to its elasticity in synergy with a corresponding elastic element) or by wires too fine to stand on their own.

Moreover, a particular technique for making contacts that are based on the raising of wires being made on a substrate of porous silicon, which wires are then embedded into a polymeric layer, is described in document WO-A-2007/104799 (the entire disclosure of which is herein incorporated by reference).

Other types of contacts are described in the document U.S. Pat. No. 6,079,987 (wherein the conductive element is formed by twisted wires), in the document US-A-2002/060579 (wherein the conductive element is obtained by a wire being fed from a reel that is coupled with a spring), in the document WO-A-98/41877 (wherein the conductive element is formed by a plunger connected to a tubular spring), and in the document U.S. Pat. No. 5,174,763 (wherein the conductive element is formed by two probes with a telescopic structure that are coupled with a spring or a tube of rubber)—the entire disclosures of which are herein incorporated by reference.

SUMMARY

In its general terms, an embodiment is based on the idea of decoupling the mechanical and electrical characteristics of the contacts.

More specifically, an embodiment provides an elastic contact device for electrically contacting electronic components. The contact device includes at least one basic module, which has a longitudinal axis. In turn, each basic module includes an elastic core (for example, of polymeric material) for defining an elasticity of the basic module; the elastic core undergoes an axial elastic deformation in response to an axial compression. A first contact terminal element (for example, a pad) and a second contact terminal element (for example, a tip) are coupled with the elastic core in axially opposed positions. Moreover, one or more elongated contact elements (for example, metallic columns) extend axially between the first terminal element and the second terminal element. In an embodiment, each elongated element is configured to have a buckling axial critical load that is higher than zero (for self-sustaining in absence of external forces during a production of the basic module) and lower than a threshold compression (for buckling thereby not contributing to the elasticity of the basic module during operation thereof); the threshold compression corresponds to a threshold deformation of the elastic core with respect to a rest condition of the elastic core ranging between 0.1% and 50%.

A further embodiment provides an electronic component comprising one or more contact devices; examples of such electronic components are sockets, test boards with these sockets, probe cards, electronic components at the package level, multi-chip modules, and power components on DCB plates.

A further embodiment provides a corresponding method for contacting electronic devices; a further embodiment provides methods for producing the contact device and the electronic component.

BRIEF DESCRIPTION OF THE DRAWINGS

One or more embodiments, as well as features and the advantages thereof, will be best understood with reference to the following detailed description, given purely by way of a non-restrictive indication, to be read in conjunction with the accompanying drawings. In this respect, it is expressly intended that the figures are not necessary drawn to scale (with some details that may be exaggerated and/or simplified) and that, unless otherwise indicated, they are merely used to conceptually illustrate the structures and procedures described herein. Particularly:

FIG. 6 schematically show an electronic component according to an embodiment;

DETAILED DESCRIPTION

Figure 1A:
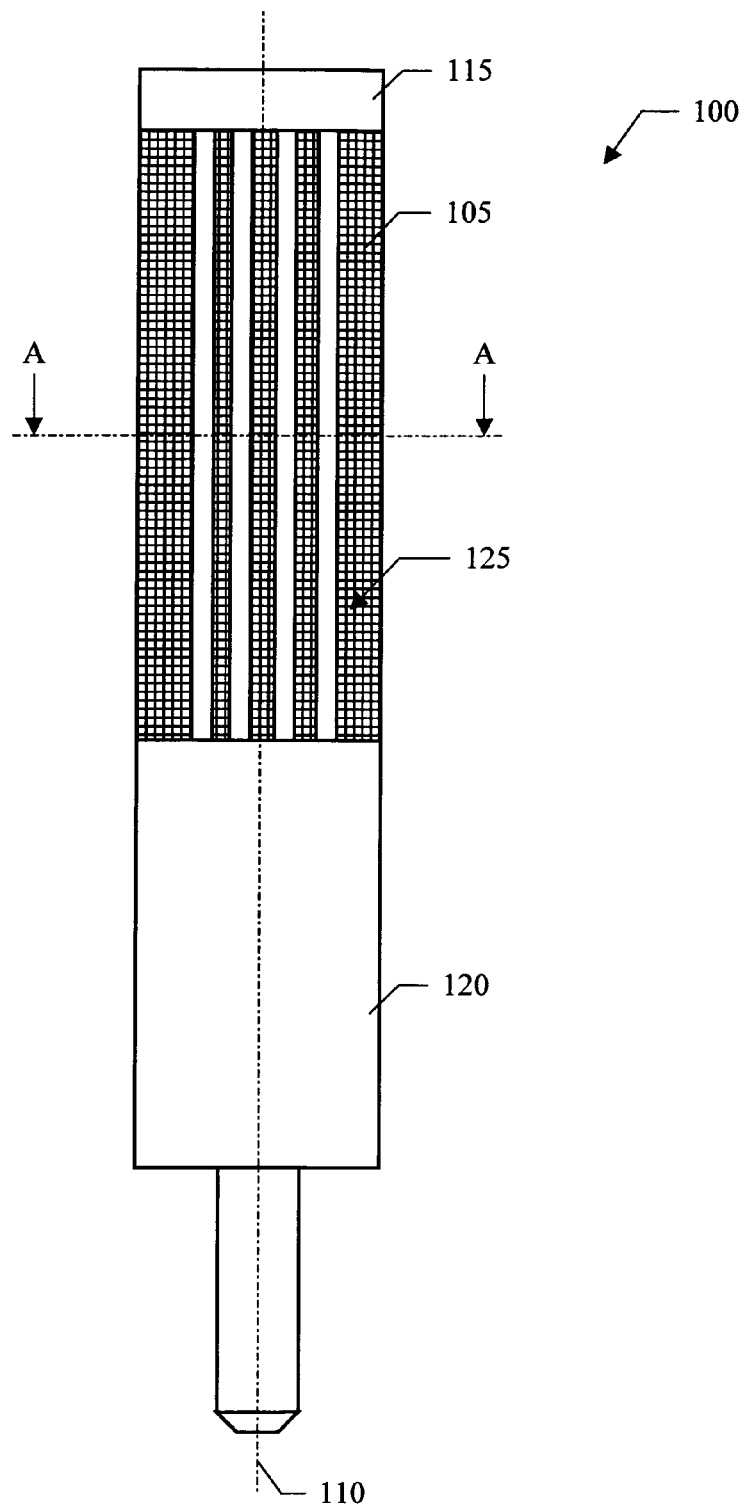
FIG. 1A-1B schematically show a contact (in different operative conditions) according to an embodiment.

With reference in particular to FIG. 1A, there is schematically shown a contact 100 of the elastic type according to an embodiment. Particularly, the contact 100 includes an elastic core 105 (for example, made of polymeric insulating material). The elastic core 105 extends along a longitudinal axis 110 of the contact 100; for example, the elastic core 105 has a circular section, with a length of approximately 10-1250 μm and a width of approximately 2-250 μm.

An electrical contact terminal element 115 (for example, made of metal) is connected to the elastic core 105 on an upper surface thereof; likewise, another electrical contact terminal element 120 (made of the same or different material) is connected to the elastic core 105 on a lower surface thereof. For example, the terminal element 115 includes a base being shaped as a pad and the terminal element 120 includes a tip. One or more electrical contact elongated elements 125 (for example, columns with circular section) extend along the axis 100 between the pad 115 and the tip 120 (for example, inside the elastic core 105).

Figure 1B:
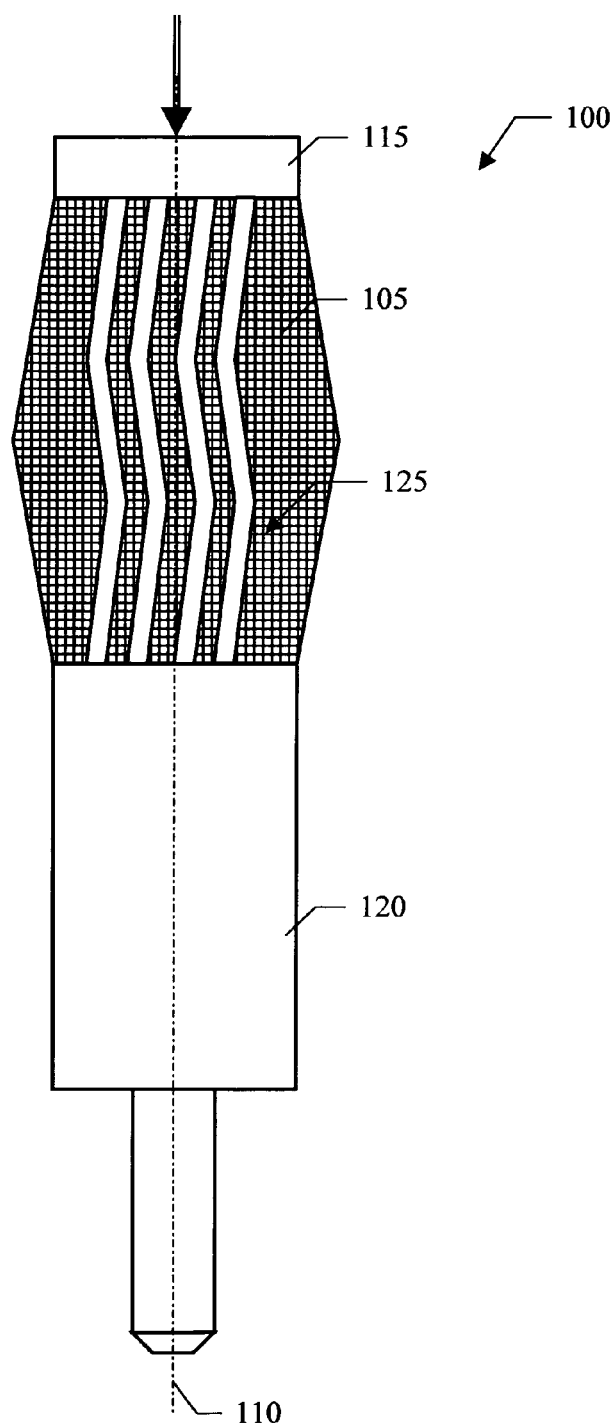

In an embodiment, the columns 125 are capable of self-sustaining in vertical direction in a rest condition of the elastic core 105, wherein no compression force is applied along the axis 110 to the elastic core 105 (to the contrary of thin conductive wires that are not capable of sustaining their weight). However, as shown in FIG. 1B, the columns 125 buckle in a normal operative condition of the contact 100 wherein an (axial) compression force is applied to the contact 100 (for example, to the pad 115 in the direction of the arrow being shown in the figure, or to the tip 120 in the opposite direction). In general terms, the buckling consists of a sudden structural collapse that occurs when the compression force reaches a limit value (known as critical load), so that no resistance to the compression force is opposed any longer.

This result is achieved by configuring the columns 125 so that their critical load is higher than zero, so as to guarantee their self-sustaining in the rest condition of the elastic core 105, but lower than a reaction force that is demanded by the contact 100 in its normal operative condition. Generally, the reaction force of the contact 100 is equal and opposite to the compression force corresponding to the deformation of the elastic core 105; therefore, the reaction force in the normal operative condition of the contact 100 (nominal reaction force) is defined by a corresponding nominal deformation of the elastic core 105. In this way, it may be possible to set the critical load of the columns 125 to any positive value (>0) being lower than an (axial) threshold force corresponding to a threshold deformation of the elastic core 105 that is equal to a predefined percentage of its nominal deformation. For example, the critical load corresponds to a threshold deformation of the elastic core 105 between approximately 0.1% and 50%; the critical load may correspond to a threshold deformation of the elastic core 105 between approximately 0.5% and 40%, for example, between approximately 1% and 30%, such as approximately equal to 10% with respect to its rest length.

An embodiment allows substantially decoupling the mechanical and electrical characteristics of the contact 100. Indeed, the electrical conductivity of the contact 100 is only defined by the (conductive) elements 115, 120 and 125; therefore, such elements 115, 120 and 125 may be made so as to obtain the desired electrical conductivity (by suitably choosing their materials and their sizes). On the contrary, the elastic core 105 is exclusively dedicated to provide the elasticity of the contact 100; therefore, the elastic core 105 may be made so as to obtain the desired elasticity (without any constraint with respect to its electrical characteristics). For example, it may be possible to choose a material for the elastic core 105 that is suitable to provide a high endurance (such as silicone); moreover, it may be possible to modify its mix and/or to embed particles (for example, carbon or silica nano-particles) so as to change its elastic characteristics at will. Moreover, it may be possible to control the elasticity of the contact 100 with a very high accuracy; indeed, in the normal operative condition the columns 125 (being buckled) do not oppose any resistance—so that they do not interfere noticeably with the mechanical behavior of the elastic core 105. This result is achieved with a remarkable constructive simplicity. Indeed, the self-sustaining columns 125 do not require any mechanical support structure during they production process (as it is instead necessary for the conductive wires), with a consequent simplification of the production process; moreover, during the production process the columns 125 may be left free; this facilitates the application of the polymer being required for making the elastic core 105.

Figure 2A:
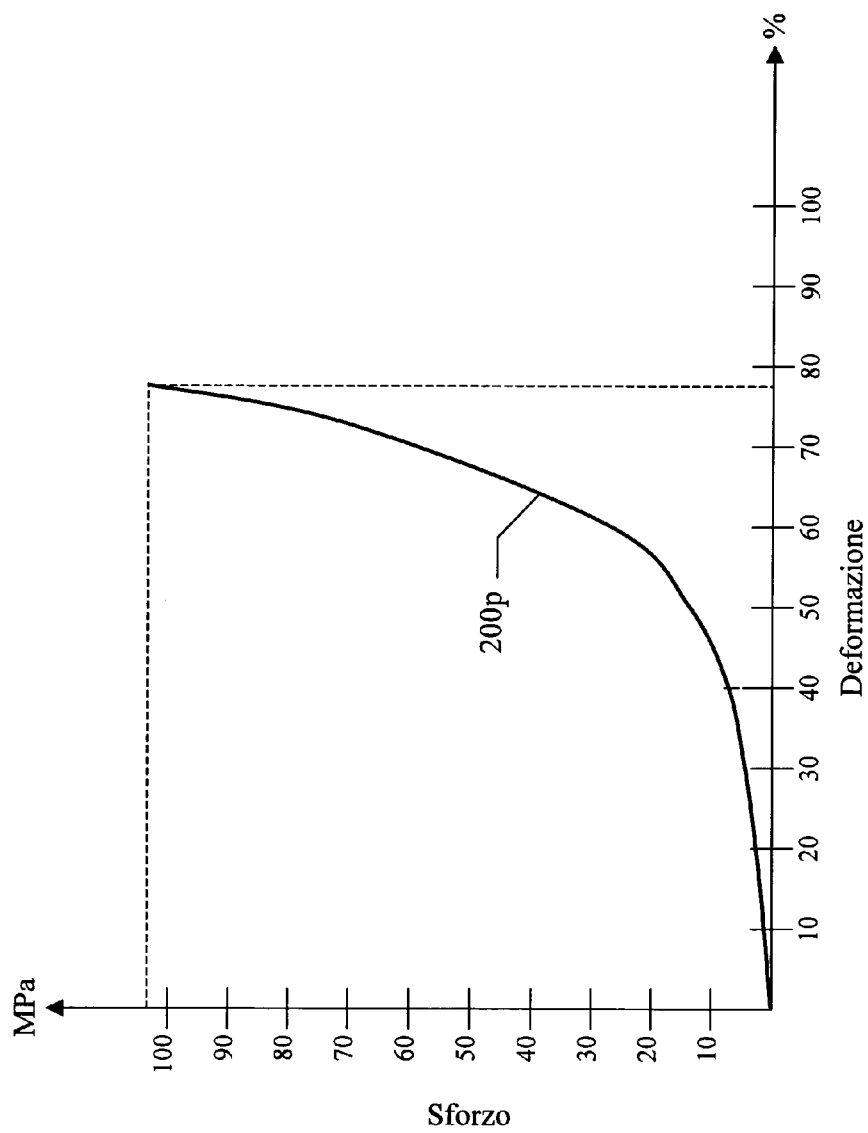
FIG. 2A-2C are exemplary diagrams that represent the elastic characteristics of contacts according to an embodiment.

Particularly, it may be possible to choose for the above-described elastic core 105 of the contact 100 a polymer having an elastic characteristic that is highly linear. For example, in FIG. 2A there is shown a diagram that represents the stress (in MPa) as a function of the deformation (in percentage with respect to the rest length) of a typical polymer by means of a corresponding characteristic curve 200p. As may be seen, the curve 200p may be approximated with a straight line (with an acceptable error) up to a deformation of approximately 40%; beyond this value of the deformation, instead, the curve 200p substantially diverges from a straight line, and it may be represented by a 5^ degree polynomial. The minimum working length of the polymer (being defined by the maximum deformation that maintains its elastic characteristics) is very high (of the order of approximately 75-80%). Therefore, the elastic cores of the proposed contacts may be kept relatively short (since their high deformability in any case provides acceptable values of the reaction force).

Figure 2B:
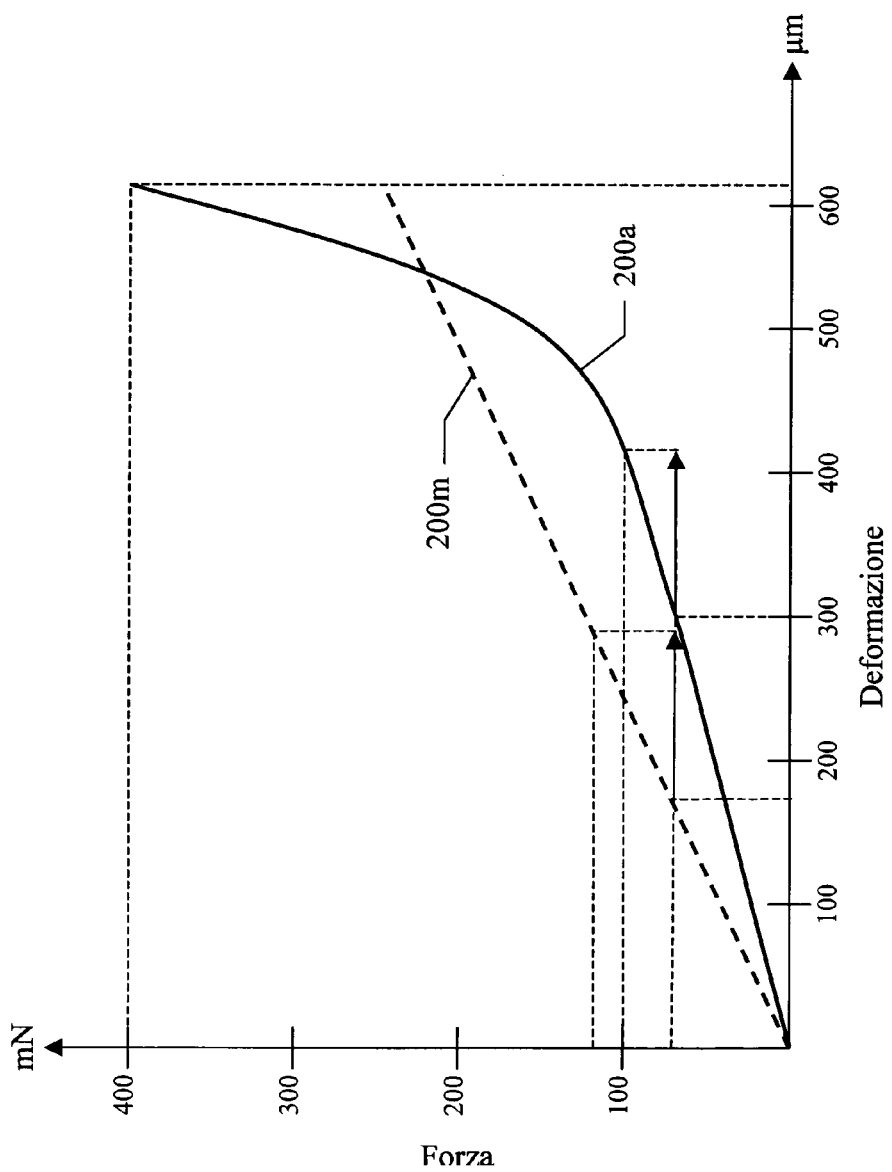

Moreover, this allows having a curve 200p with a pattern wherein the stress at the beginning increases to a reduced extent as a function of the deformation (with respect to a linear pattern). In this respect, let us consider FIG. 2B, which shows an initial portion of a characteristic curve 200a of an elastic core being made with the polymer of above, which now plots the force (in mN)—given by the stress being multiplied by the area of the section of the elastic core, approximately 10,000 (μm)$^2$ in the example at issue—again as a function of the deformation (now expressed in absolute terms in μm). Moreover, there is also shown a characteristic curve 200m of a typical spring in dashed line (with a linear elastic characteristic); particularly, the curve 200m consists of a straight line, which is above the curve 200a at the beginning. Let us suppose now that the contacts are used in a probe card or a socket that requires a nominal reaction force of approximately 80 mN (8 g); the nominal reaction force is obtained with a nominal deformation of approximately 300 μm in the case of the elastic core (curve 200a) and with a nominal deformation of approximately 170 μm in the case of the spring (curve 200m). Let us suppose, moreover, to have an expected planarity error equal to approximately 125 μm, so that an additional deformation is necessary to guarantee that all the contacts of the probe card or the socket undergo such nominal deformation. The additional deformation force to be applied to the probe card or the socket (in order to obtain this additional deformation) is equal to approximately 100−80=20 mN (2 g) in the case of the elastic core and approximately 130−80=50 mN (5 g) in the case of the spring. Therefore, the corresponding additional reaction force that is exerted by the first contacts that reach the wafer or the package (because of their additional deformation) is remarkably reduced when they are made with the elastic cores with respect to when they are made with the springs; in this way, there is obtained a greater uniformity of the reaction force that is exerted by the contacts. Moreover, this limits the increase of the compression force to be applied to the probe card or the socket (in order to overcome the additional reaction force being exerted by the contacts); for example, in a probe card or a socket with 2,000 contacts—wherein statistically approximately 50% of them undergo a minimum compression force (equal to the nominal compression force) and approximately 50% of them undergo a maximum compression force (equal to the nominal compression force plus the additional compression force), it is necessary to apply a total compression force of approximately 1,000·80+1,000·100=180N in case the contacts are made with the elastic cores (against a compression force of approximately 1,000·80+1,000·130=230N in case the contacts are made with the springs). Considering that generally the force with which the wafer is pushed against the probe card or the package is inserted into the socket is at most approximately 200N (unless particular chucks are provided), this shows that in the case of the springs it may not be possible to guarantee that all the contacts are in a condition of good electrical connection.

Figure 2C:
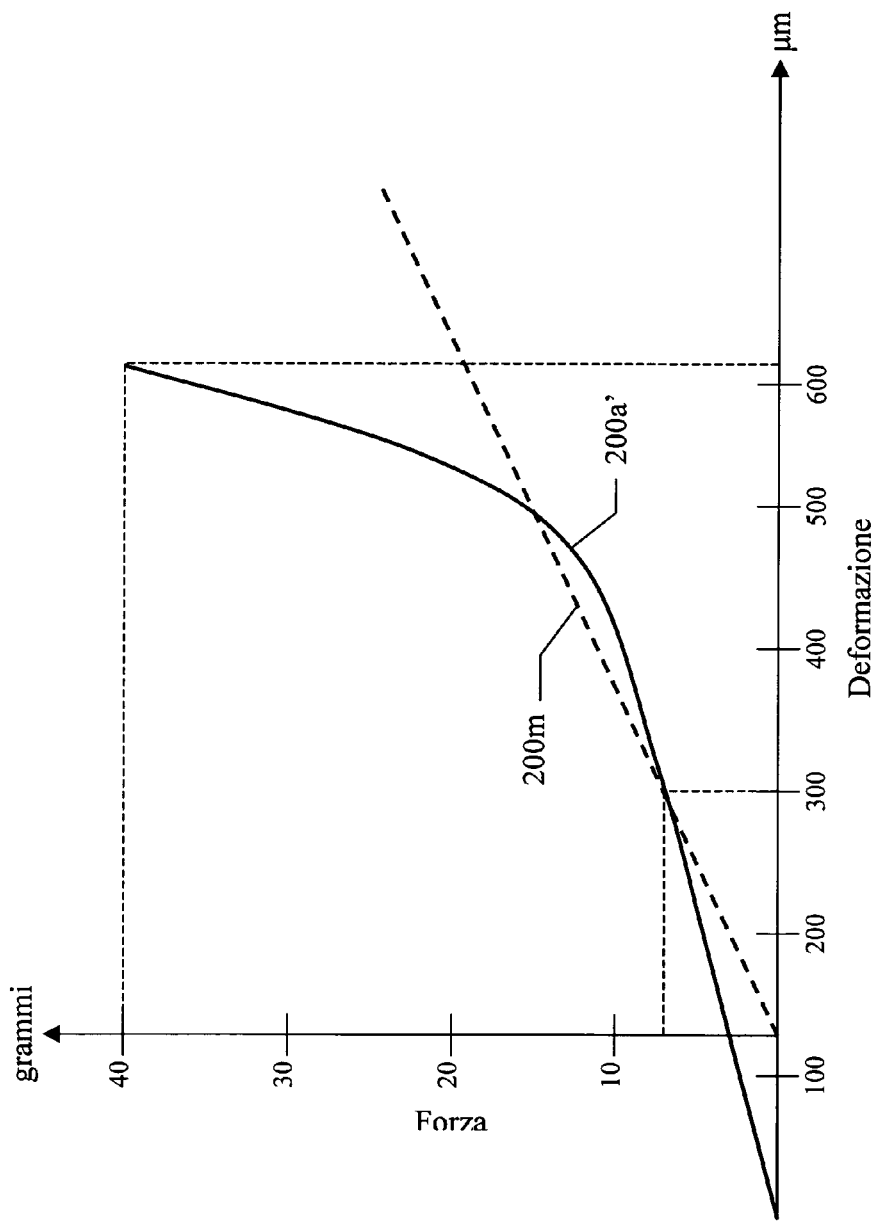

It is noted that the deformation being necessary to obtain the nominal force (approximately 80 mN) is greater in the case of the elastic core (approximately 300 μm) with respect to the springs (approximately 170 μm), because the force increases as a function of the deformation to a lower extent at the beginning in the elastic core (curve 200a) with respect to the spring (curve 200m). However, this drawback may be easily overcome by pre-deforming the elastic core; this result is achieved by applying a permanent deformation to the elastic core (in a rest condition of the contact as well, wherein no compression force is applied from the outside)—for example, between approximately 0.01% and 70%, for example between approximately 0.1% and 50% (such as between approximately 0.5% and 40%). In the specific case at issue, as shown in FIG. 2C, it may be possible to apply a pre-deformation of approximately 130 μm to the elastic core, so as to have a new characteristic curve 200a' (obtained by translating the characteristic curve of above leftwards by this amount). In this way, the nominal reaction force of approximately 80 mN corresponding to the nominal deformation of approximately 300 μm is now obtained with an additional deformation of the elastic core (with respect to its pre-deformation) of only approximately 300−130=170 μm like in the case of the spring (with the advantages pointed out above with respect to the uniformity of the reaction force of the contacts). In this case, moreover, the critical load of the columns (defined according to the threshold deformation of the elastic core, with respect to its rest condition without pre-deformation) may be chosen so that the columns have already buckled in the rest condition of the contact (wherein the elastic core is pre-deformed), or in any case they buckle in response to a minimal additional deformation of the elastic core.

The results pointed out above may be achieved with different structures of the described contact.

Figure 3A:
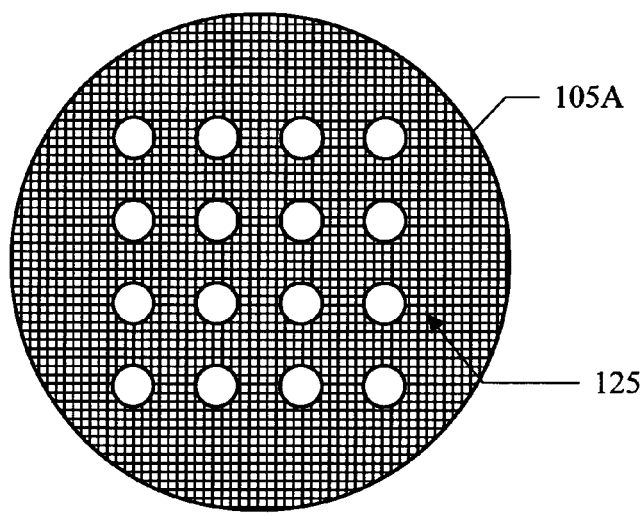
FIG. 3A-3C are cross-section views of a contact according to different embodiments.
Figure 3B:
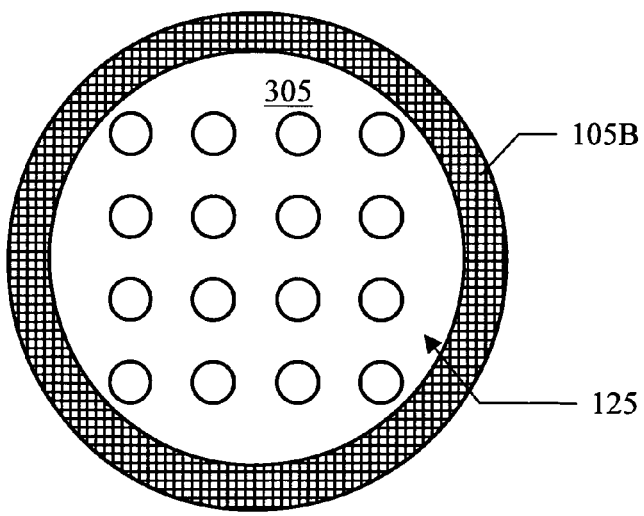
Figure 3C:
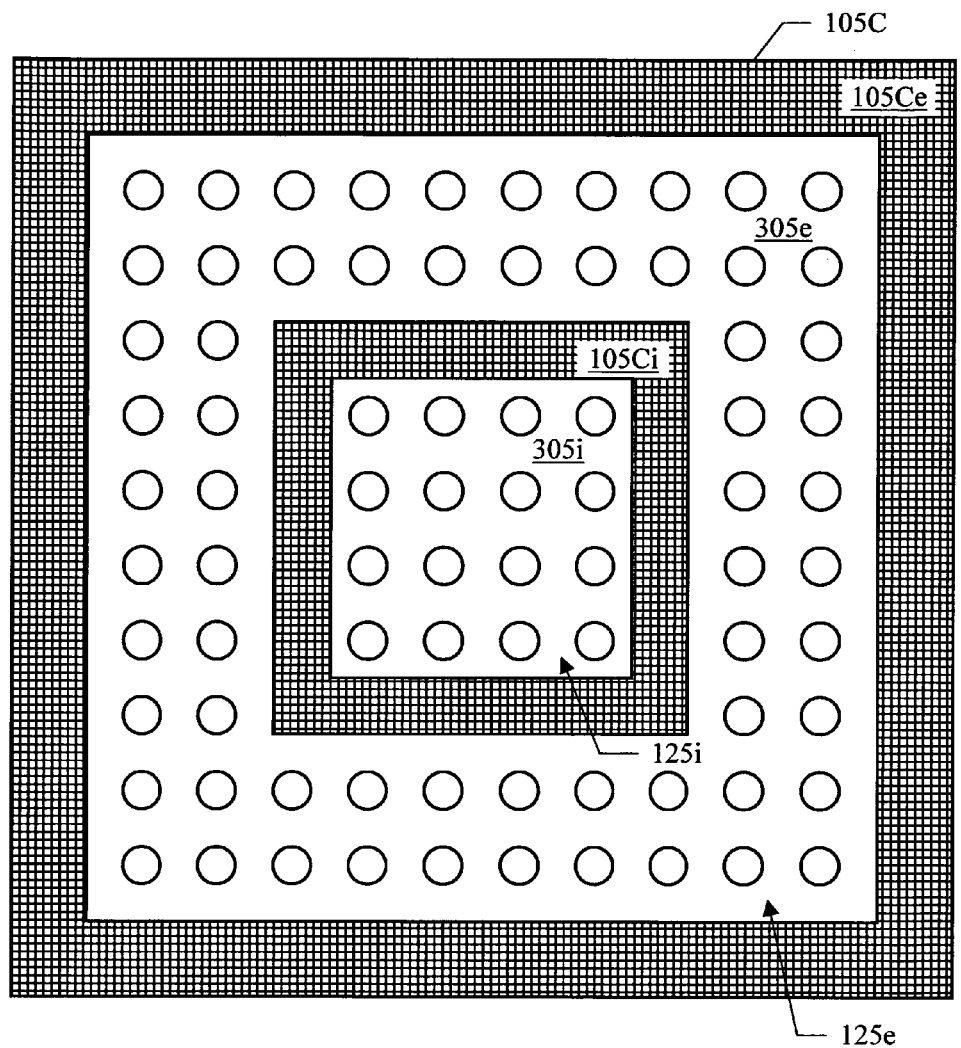

Particularly, cross-section views of the proposed contact (along the plane A-A of FIG. 1A) according to different embodiments are shown in FIG. 3A-3C.

With reference to FIG. 3A, the elastic core (differentiated with the reference 105A) has a solid structure (for example, with circular section); therefore, the columns 125 (16 in the example at issue) are completely embedded in the elastic core 105A. Such structure facilitates the production of the contact, and offers optimal mechanical properties of the elastic core 105A; moreover, it avoids (or at least reduces) the risk that the buckled columns 125 take a helicoidal shape, which would involve an increase of their electrical impedance (with consequent reduction of the frequency response of the contact).

Alternatively, as shown in FIG. 3B, the elastic core (differentiated with the reference 105B) has a hollow structure (for example, with toroidal section); particularly, the elastic core 105B is crossed by a through-hole 305 (or more) along its longitudinal axis. In this case, the columns 125 are arranged inside of hole 305; the columns 125 are spaced apart among them and from an internal surface of the elastic core 105B that defines a sidewall of the hole 305 (for example, by some μm). This implementation facilitates the buckling of the columns 125, since they are now free to deform within the hole 305. Moreover, the columns 125 deform by bending randomly; therefore (if a relatively high number of columns 125 is provided, in any case higher than one), the columns enter in contact among them once they have bucked. This creates an irregular conductive hank, which reduces the total electrical impedance of the columns 125 (with respect to the case wherein a single column buckles thereby taking a helicoidal shape).

A different embodiment of the contact is instead illustrated in FIG. 3C. In this case, the elastic core (differentiated with the reference 105C) has a composite structure (for example, with a square section). Particularly, the elastic core 105C includes an inner hollow portion, or more (denoted with 105Ci); the hollow portion 105Ci is crossed by a through-hole 305i (or more) inside which part of the (inner) columns, denoted with 125i, are arranged. The elastic core 105C then includes an outer hollow portion (denoted with 105Ce), which is made of the same or different material; the hollow portion 105Ce is crossed by a through-hole 305e (or more) inside which the hollow portion 105Ci is arranged. In this way, between the hollow portion 105Ce and the hollow portion 105Ci a hollow space 305e (with frame-shaped section) is formed, inside which the other (external) columns, denoted with 125e, are arranged.

In this way, the columns 125i and the columns 125e define a coaxial conductive structure (with the columns 125i that may be used as a central or warm pole, and the columns 125e that may be used as contact braid at a reference voltage, or ground). This allows making flexible coaxial wires, which offer remarkable advantages in terms of impedance matching and working frequency.

Figure 3D:
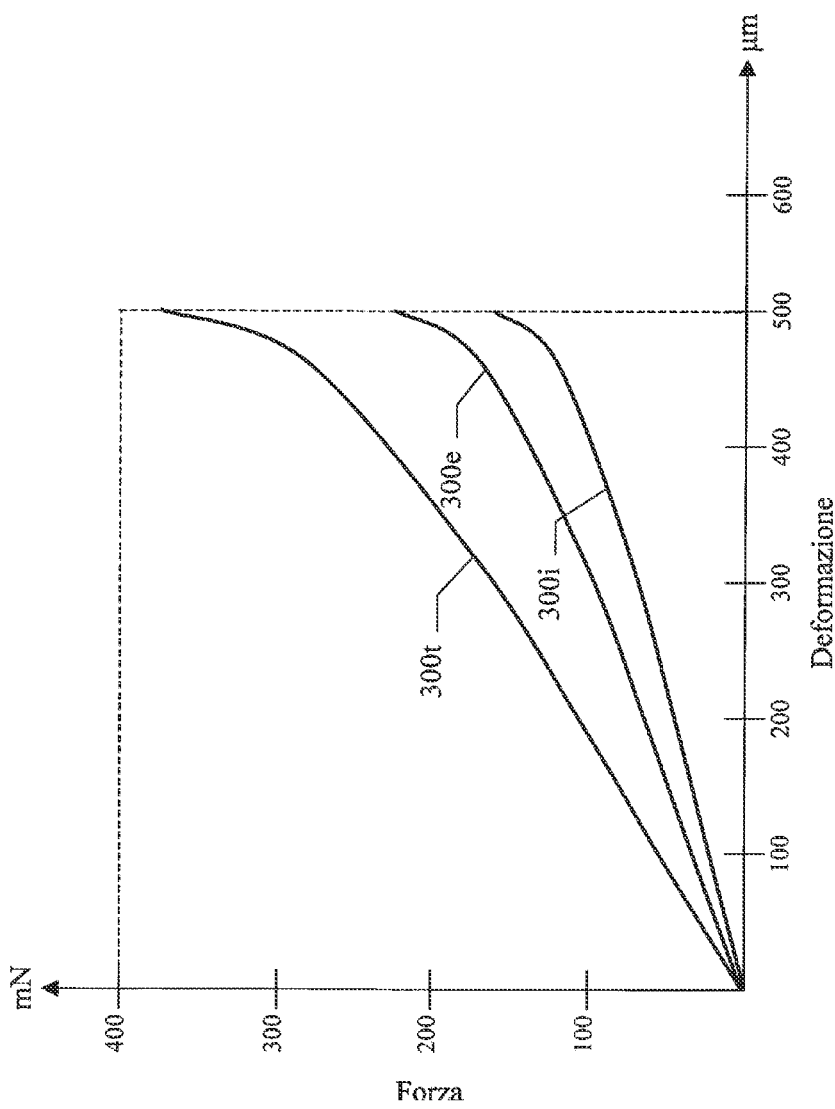
FIG. 3D is an exemplary diagram that represents elastic characteristics of the contact of FIG. 3C.

The elasticity of the electrical contact is instead defined by the parallel of the characteristic curves of the hollow portions 105Ci and 105Ce. For example, as shown in FIG. 3D, let us suppose that the hollow portion 105Ci has a characteristic curve 300i and that the hollow portion 105Ce has a characteristic curve 300e-which as above express the force (in mN) as a function of the deformation (in μm). A total characteristic curve 300t of the whole elastic core 105Ci, 105Ce is obtained, for every deformation, by adding the corresponding forces of the curve 300*i* and of the curve 300*e*.

Generally, in order to design the columns of the electrical contact (so that they buckle in the normal operative condition of the contact), it is noted that the polymer being used to make the elastic core of each one of them has a non-linear elastic characteristic and it may be modeled as a Mooney-Rivlin solid. In the Mooney-Rivlin solids, it may be possible to define (in analogy with the Young's modulus of the materials with linear elastic characteristic that follow the Hook's law), a secant elastic modulus E'(ϵ) being equal to the derivative of the stress with respect to the deformation (variable along its characteristic curve), that is:

$$E'(\varepsilon) = \frac{\partial \sigma(\varepsilon)}{\partial \varepsilon},$$

where σ is the stress, ϵ is the deformation, and E'(ϵ) is the secant modulus for the deformation c. The stress corresponding to the threshold deformation of the elastic core may be calculated by linearizing the elastic characteristic of the polymer according to a Young's modulus being equal to the secant modulus corresponding to the threshold deformation (denoted with $\epsilon_l$):

$$E'(\varepsilon_l) = \frac{\partial \sigma(\varepsilon_l)}{\partial \varepsilon}$$

The critical load of the columns is then chosen so as to satisfy the following relation:

$$0 < Fc \leq S \cdot E'(\epsilon_l) \cdot \epsilon_l,$$

where S is the area of the section of the elastic core, E'($\epsilon_l$)·$\epsilon_l$ is the threshold stress corresponding to the threshold deformation $\epsilon_l$ (based on the Hook's law), and Fc is the critical load. For example, in the case of a threshold deformation $\epsilon_l$=10% in an elastic core with a section S=2.500 (µm)² being made of a polymer having a corresponding secant modulus E'(10%)=10 MPa, the columns will be designed so as to have a critical load 0<Fs≤2.500·10⁻¹²·10·10⁶·0.1=2.5·10⁻³=2.5 mN.

The critical load of each column is generally defined by the following formula:

$$Fc = \frac{\pi^2 \cdot E \cdot I}{(K \cdot L)^2}$$

where E is the Young's modulus of the material of which the column is made, I is the moment of inertia of the column, K is a factor depending on the type of constraint of the column, and L is the length of the column. Particularly, the constraint factor K takes the value K=0.5 when the column is constrained at both its ends, and the value K=2.0 when the column has an end that is constrained and the other end that is free. In the case of a column with solid circular section, its moment of inertia becomes:

$$I = \frac{\pi^2 \cdot r^4}{4}$$

where r is the radius of the column. Therefore, once the length L of the column has been set (being given by the length of the elastic core in its resting condition), it may be possible to choose its material (that defines the Young's modulus E) and its radius r so as to obtain the desired critical load Fs. For example, a column with a length L=100 µm and a radius r=1 µm being made of copper (E=110 GPa) and constrained at both its ends (K=0.5), has a critical load of approximately 20 mN. It is noted that the critical load depends on the square of the length L, so that this allows scaling the sizes of the contacts in a very high way.

Moreover, this column is clearly capable of self-sustaining. Indeed, its length L does not exceed a critical length $J_c$ beyond which the column would buckle under its weight, which critical length $L_c$ is defined by the following formula:

$$L_c = \left(\frac{1,9594 \cdot E \cdot r^2}{\rho \cdot g}\right)^{\frac{1}{3}}$$

where ρ is the density of the column and g=9.81 m/s² is the gravitational acceleration. For example, in the case at issue (wherein the density of the copper is p=8.9 g/cm³), there is obtained a critical length $L_c$=5.8 mm (far higher than the length L=100 µm).

The columns may be made so as to have a non-uniform structure along their longitudinal axis. For example, the section may be reduced at the center with respect to the ends; this result may be achieved by gradually shortening the diameter of the columns (moving from the opposite ends towards the center), so as to obtain a difference between a maximum diameter (at the ends) and a minimum diameter (at the center) comprised between 5-99% of the maximum diameter. This allows reducing the critical load of the columns for the same structure; consequently, it may be possible to use columns that are wider (and more conductive) but that in any way buckle in the normal operative condition of the contact. Moreover, it may also be possible to vary the section of the columns in multiple specific points along the longitudinal axis; this allows establishing the exact zones wherein the columns will deform at their buckling.

Figure 4A:
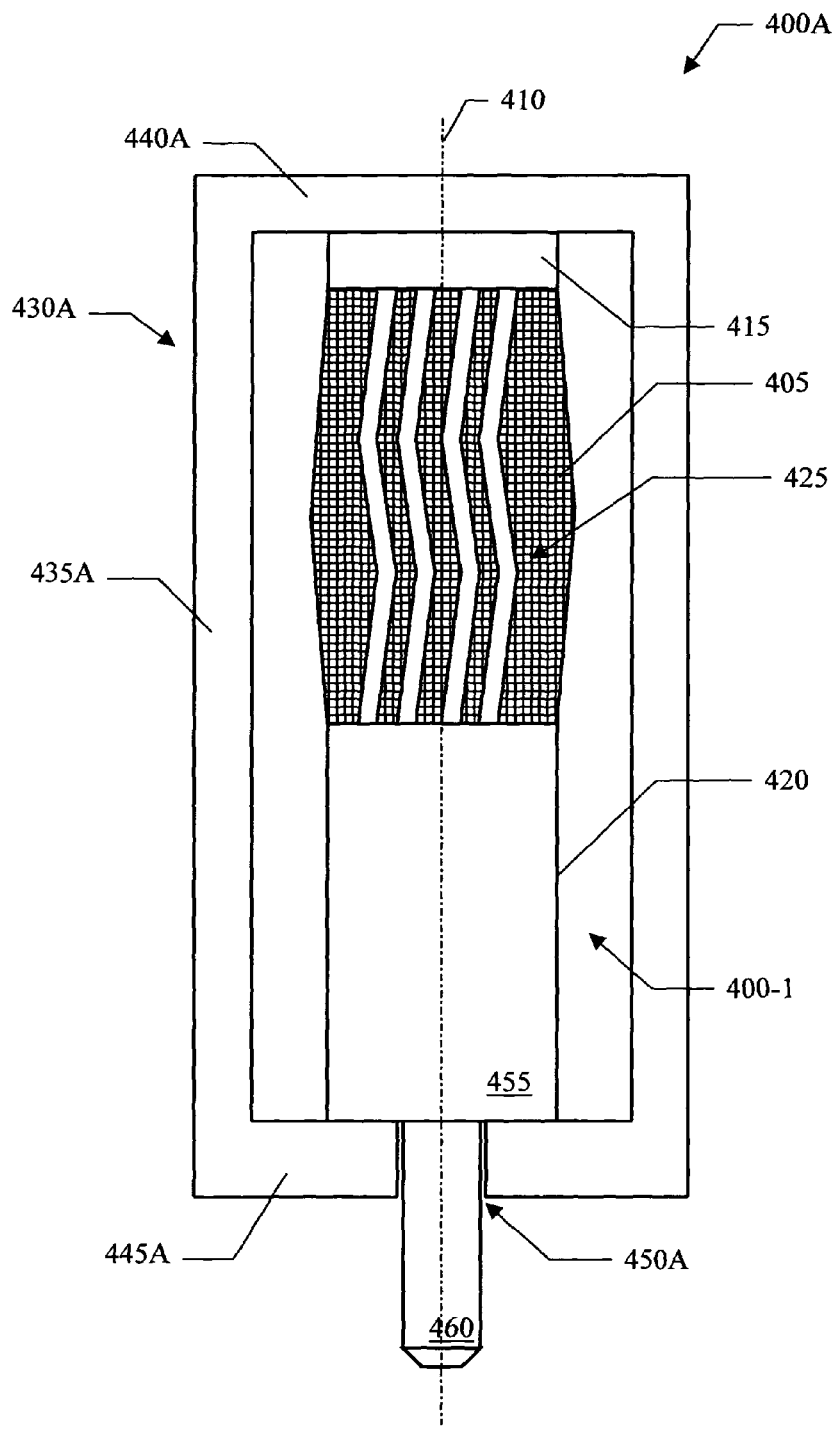
FIG. 4A and FIG. 4B schematically show a contact (in different operative conditions) according to a further embodiment.

Passing now to FIG. 4A, there is schematically show a contact 400A (according to a further embodiment), which implements a pogo-pin. The contact 400A includes a basic module 400-1 with a structure that is completely analogous to that of the contact being illustrated in FIG. 1A (i.e., with an elastic core 405 that extends along a longitudinal axis 410 of the contact 400A, a pad 415, a tip 420, and multiple columns 425).

The basic module 400-1 is enclosed within a rigid shell 430A; for example, the shell 430A is formed by a bush 435A, which is closed by an upper disc 440A and by a lower disc 445A.

Particularly, the pad 415 is fastened under the disc 440A, at the center thereof. The disc 445A is instead provided with a central through-hole 450A for the exit of the tip 420. The tip 420 has a tapered structure with a (wider) inner base 455 and a (narrower) outer needle 460. The needle 460 has a section matching the one of the hole 450A, so as to allow the needle 460 to slide freely through the hole 450A along the axis 410; the base 455 instead has a section that is larger than the one of the hole 450A, so as to abut against the disc 445A.

Figure 4B:
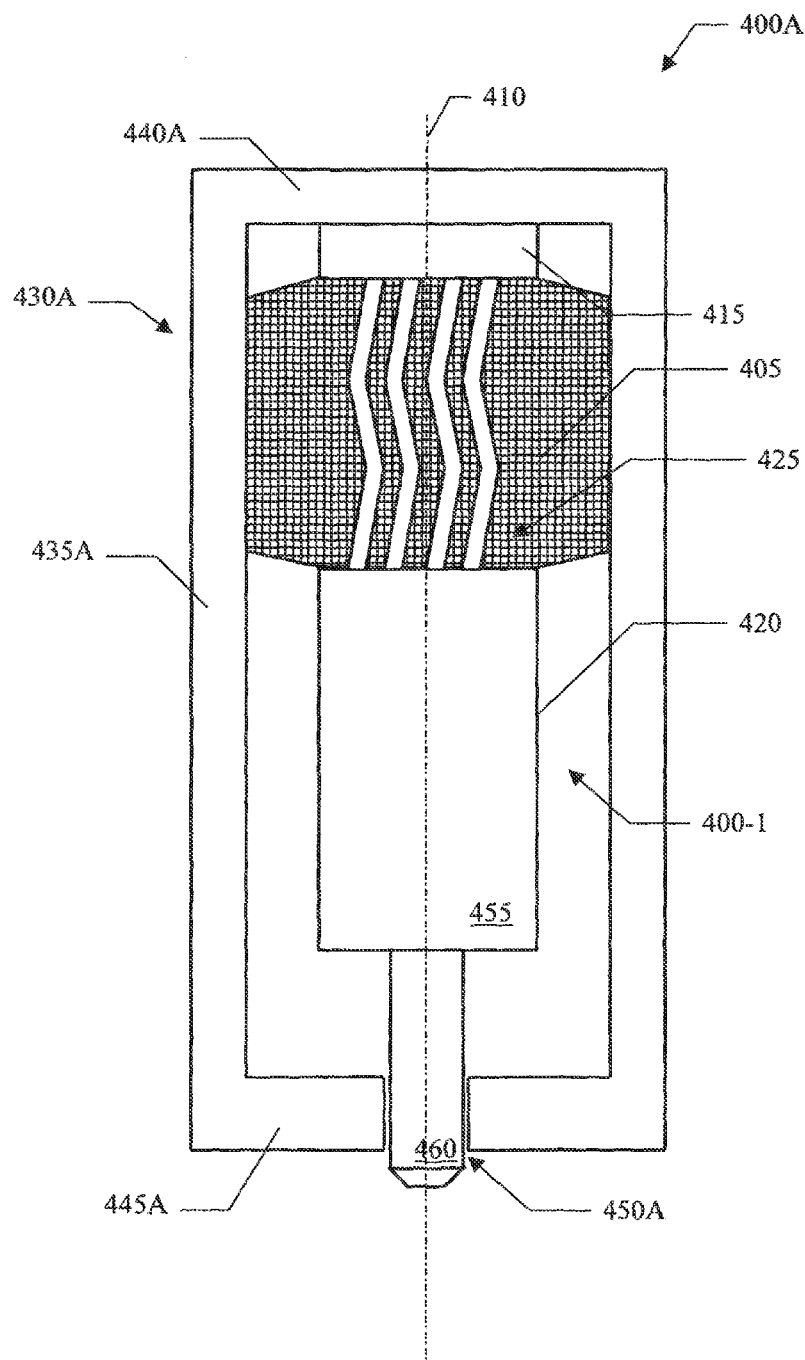

The bush 435A consists of a hollow cylinder, with a width that is greater than the one of the elastic core 405. The bush 435A has a diameter allowing the elastic core 405 to expand radially when it is compressed. In addition, the bush 435A may also be used to limit the deformation, and then the reaction force of the elastic core 405; indeed, once the elastic core 405 has reached the bush 435A (as shown in FIG. 4B), it behaves as a rigid body that does not allow further deformations. For example, if the elastic core 405 has a radius of 16 μm and a rest length of 100 μm, it takes up a volume of approximately:

$$\pi \cdot 16^2 \cdot 100 = 80.384 \ (\mu m)^2.$$

If the bush 435A has an inner radius of 22.6 μm, the elastic core 405 may deform at most until reaching such width; this is obtained when its length becomes:

$$\frac{80.384}{\pi \cdot 22,6^2} = 50 \ \mu m;$$

in this way, the deformation of the elastic core 405 is limited to about 50/100=50%.

Returning to FIG. 4A, the bush 435A may also be used to pre-deform the elastic core 405. For this purpose, it may be possible to set its length to be lower than the one of the portion of the basic module 400-1 being formed by the pad 415, the elastic core 405 and the base 455 of the tip 420.

The shell 430A may be made entirely of insulating material (for example, ceramics, polymer or intrinsic silicon), with the exception of an inner portion of the disc 440A (for example, made of metal) that is connected to the pad 415 for implementing the desired electrical connection. Alternatively, instead possible to the bush 435A as well is made of conductive material (suitably electrically insulated from the inner conductive portion of the disc 440A); for example, the bush 435A may be made of metal, which is covered internally by a hard insulating material—such as Diamond Like Carbon (DLC)—in order to protect it from scratches in case of possible contact with the tip 420; the disc 445A may be made either of insulating material or of conductive material (for example, of metal being covered internally by DLC as well to protect it from scratches being caused by the tip 420). In this way, a pogo-pin is obtained with a coaxial structure (with the conductive inner portion of the disc 440A, the pad 415, the columns 425, and the tip 420 that form the central pole, while the bush 435A and the possible disc 445A form the ground contact).

Figure 4C:
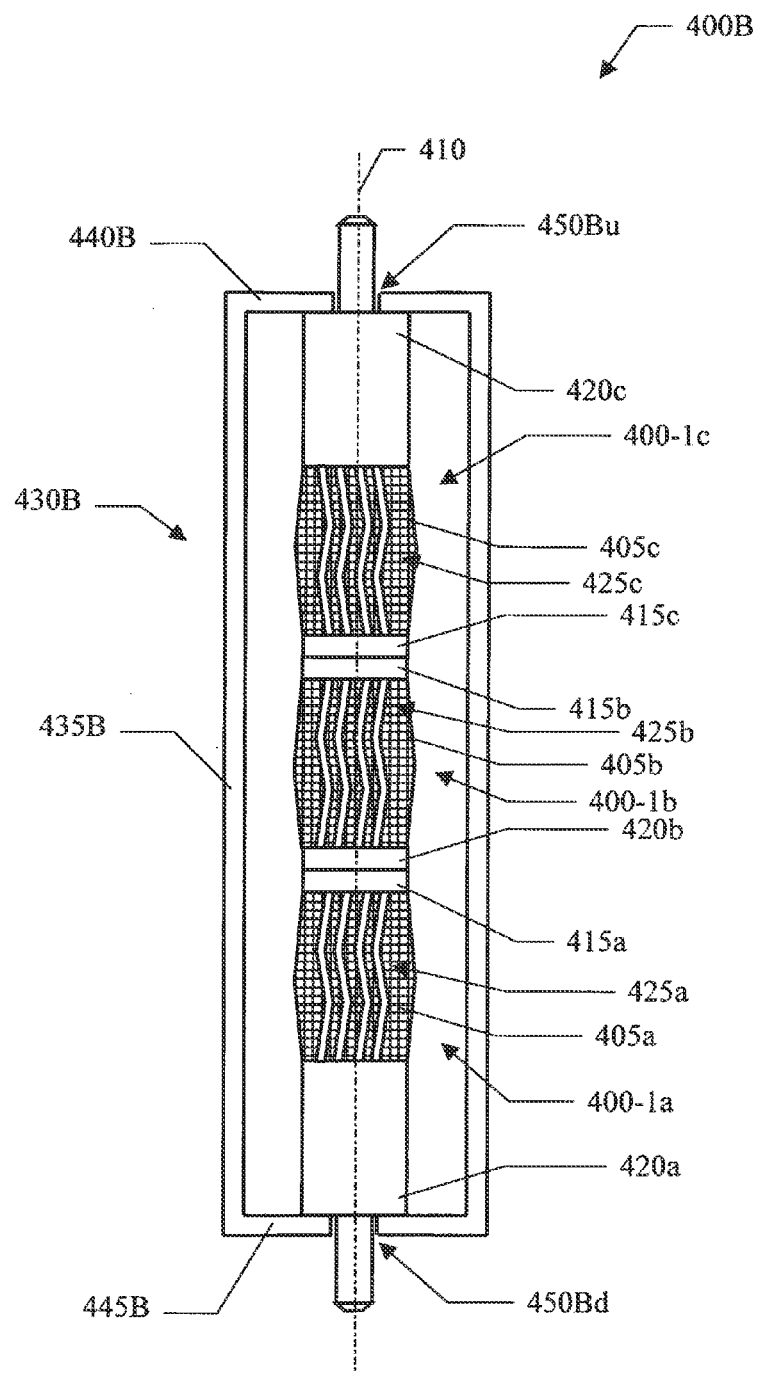
FIG. 4C schematically shows a contact according to a further embodiment.

Continuing to FIG. 4C, there is schematically shown a contact 400B (again a pogo-pin) according to a further embodiment. In this case, the contact 400B includes multiple basic modules 400-1a, 400-1b and 400-1c being connected in series. The basic module 400-1a has a structure that is completely analogous to that of the contact being illustrated in FIG. 1A (i.e., with an elastic core 405a that extends along a longitudinal axis 410 of the contact 400B, a pad 415a, a tip 420a, and multiple columns 425a); the basic module 400-1b has a similar structure with the only difference that its end elements are both pad-shaped (i.e., with an elastic core 405b that extends along the axis 410, an upper pad 415b, a lower pad 420b, and multiple columns 425b), while the basic module 400-1c has the same structure as the basic module 400-1a (i.e., with an elastic core 405c that extends along the axis 410, a pad 415c, a tip 420c, and multiple columns 425c) simply overturned axially. The pad 415a of the basic module 400-1a is connected to the pad 420b of the basic module 400-1b, whose other pad 415b is connected to the pad 415c of the basic module 400-1c. The basic modules 400-1a, 400-1b, 400-1c are enclosed within a similar rigid shell 430B, which is made of insulating and/or conductive material (being formed by a bush 435B, an upper disc 440B and a lower disc 445B). As above, the disc 445B is provided with a central through-hole 450Bd for the exit of the tip 420a (of the basic module 400-1a); in this case, however, the disc 440B as well is provided with a central through-hole 450Bu for the exit of the tip 420c (of the basic module 400-1c).

Figure 4D:
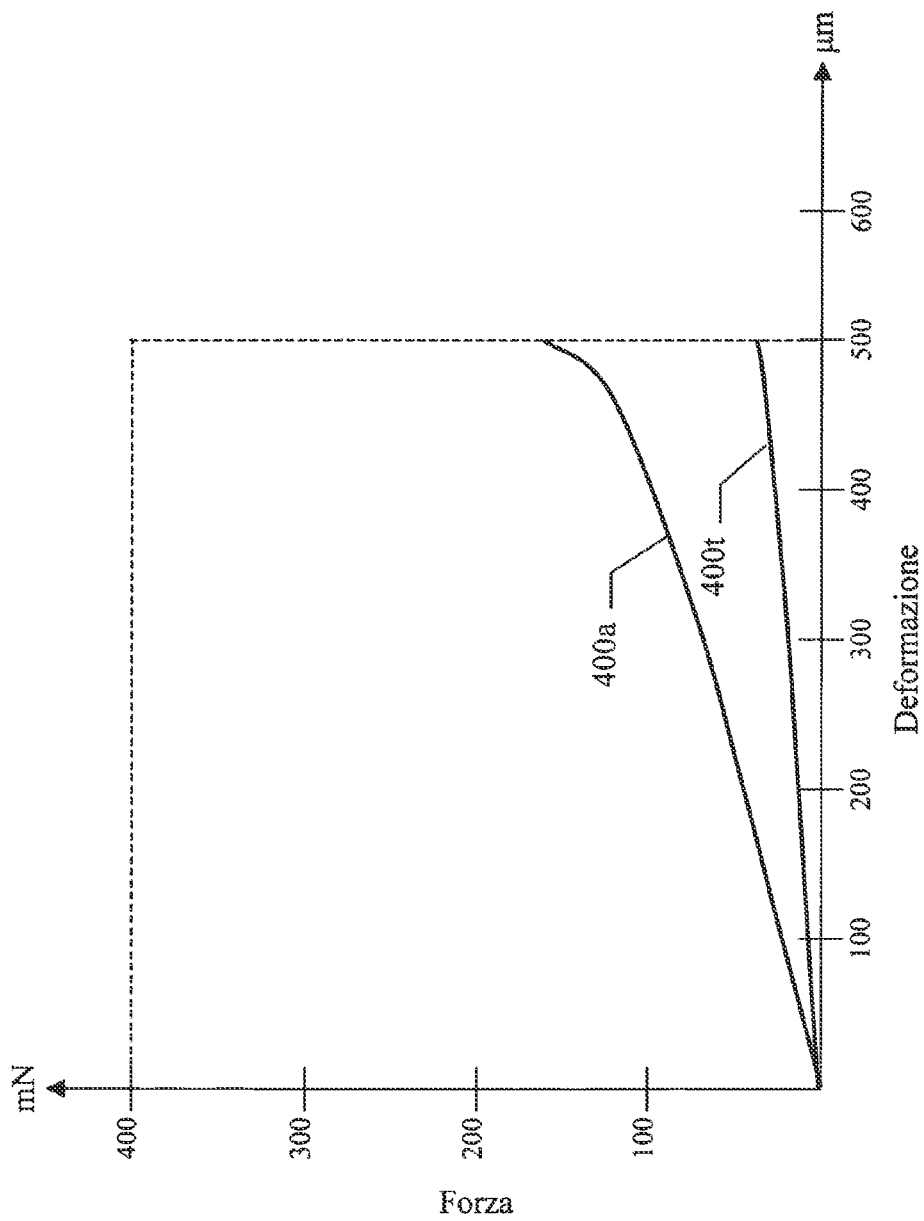
FIG. 4D is an exemplary diagram that represents elastic characteristics of the contact of FIG. 4C.

In this way, there is obtained a contact 400B with a twofold compliant structure being defined by the tips 420a and 420c (electrically connected between them through the elements 425a, 415a, 420b, 425b, 415b, 415c and 425c). The elasticity of the contact 400B is now defined by the elastic cores 405a, 405b and 405c being connected in series. For example, as shown in FIG. 4D, let us suppose that all the elastic cores have a same characteristic curve 400a—which as above expresses the force (in mN) as a function of the deformation (in μm). A total characteristic curve 400t of the whole elastic core 405a, 405b, 405c is obtained, for every force, by adding the corresponding deformations of the curve 400a (i.e., by multiplying its common value by 3). This allows obtaining a flexibility of the contact that is very high.

Figure 5B:
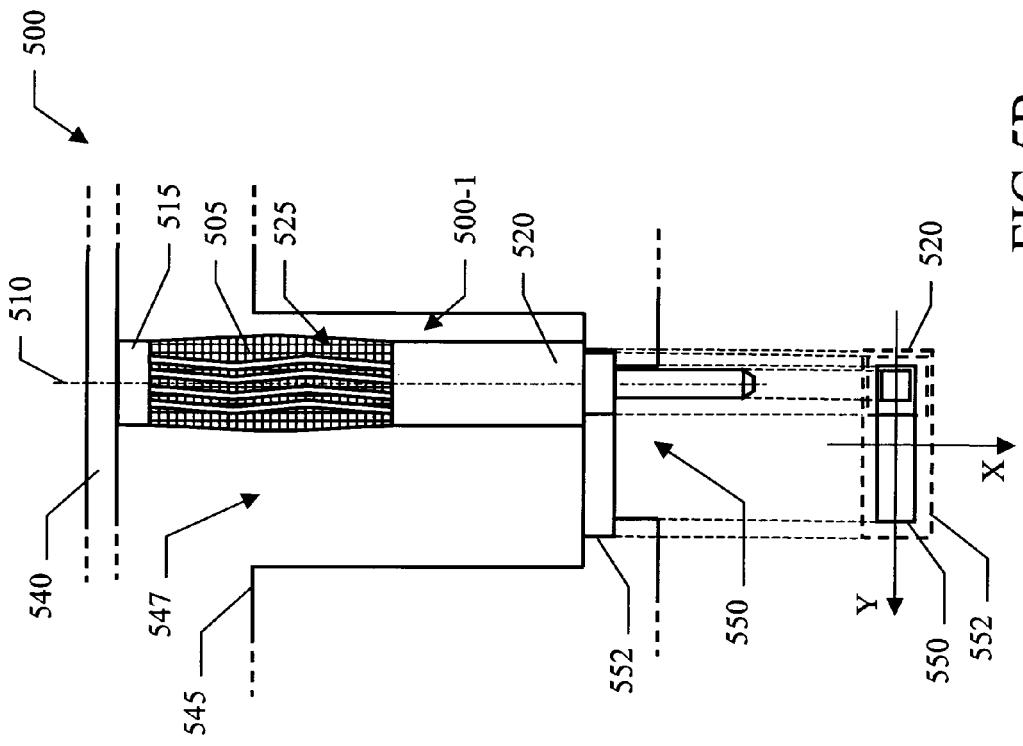
FIG. 5A-5C schematically show a contact (in different operative conditions) according to a further embodiment.
Figure 5A:
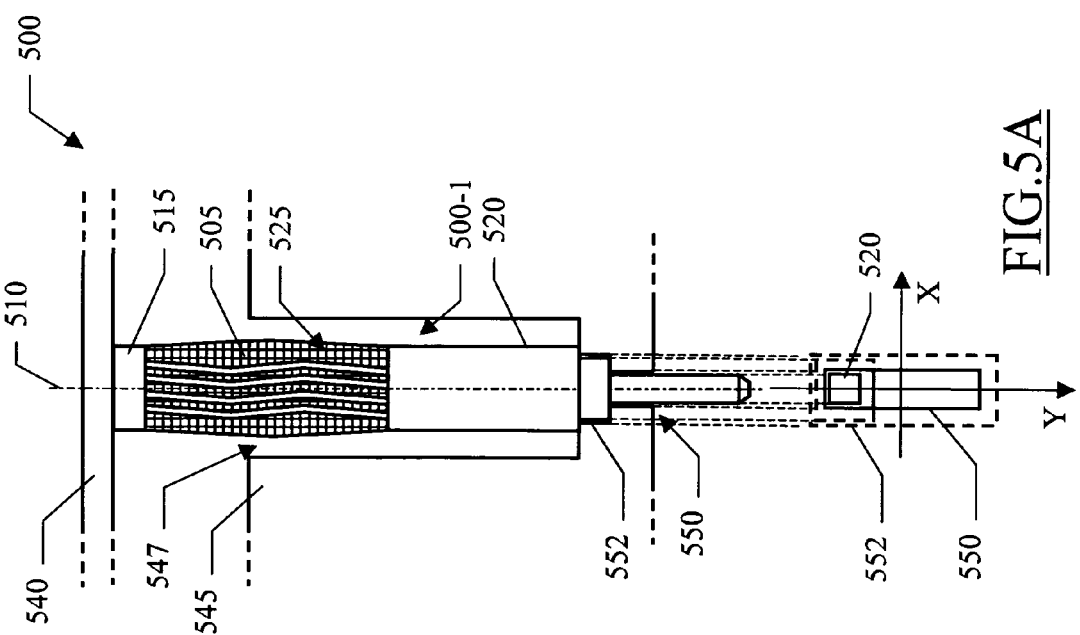

With reference now to FIG. 5A and FIG. 5B together, there is schematically shown a contact 500 (according to a further embodiment), which is used in a probe card (or in a socket by suitably varying its size); in particular, FIG. 5A shows the contact 500 in bottom view and front view, while FIG. 5B shows the contact 500 in bottom view and side view. The contact 500 includes a basic module 500-1 with a structure that is completely analogous to that of the contact being illustrated in FIG. 1A (i.e., with an elastic core 505 that extends along a longitudinal axis 510 of the contact 500, a pad 515, a tip 520, and multiple columns 525).

Several basic modules 500-1 (only one shown in the figure) are enclosed within a rigid support structure, which includes an upper plate 540 and a lower plate 545. Particularly, the plate 540 is formed by an insulating substrate with conductive tracks; the basic modules 500-1 are fastened under the plate 540, so that the pad 515 of each basic module 500-1 is connected to a correspondent track of the plate 540. The plate 545 is instead made entirely of insulating material, and has a hollow 547 for housing each basic module 500-1; the hollow 547 has a width that is greater than the one of the elastic core 505 of the basic module 500-1, so as to allow it to expand radially when it is compressed (and possibly to limit its deformation to a maximum value). A through-hole 550 with a spot-facing 552 is made on the bottom of each hollow 547 for the exit of the tip 520 of the corresponding basic module 500-1; particularly, the tip 520 has a tapered structure with a base, from which there projects a slightly narrower platform (which is received into the spot-facing 552), and from which there extends a thin needle (which crosses the hole 550). Along a direction X, the hole 550 has a section matching the needle of the tip 520 and the spot-facing 552 has a section matching the platform of the tip 520; along a direction Y, instead, the hole 550 has a section being larger than the needle of the tip 520 and the spot-facing 552 has a section being larger than the platform of the tip 520.

The plate 540 is fastened to the plate 545 (for example, by means of screws not shown in the figure). The distance between the two plates 540 and 545 may be regulated so that the space between the plate 540 and the bottom of the hollow 547 is lower than the portion of the basic module 500-1 being formed by the pad 515, the elastic core 505 and the base of the tip 520, so as to have a pre-deformation of the elastic core 505. The above-described structure allows making probe cards being very compact, since the pitch of the basic modules 500-1 is defined only by the space being necessary to allow the desired deformation of their elastic cores 505. Moreover, it is possible to repair the probe card by replacing each basic module 500-1 individually (when it is damaged).

Figure 5C:
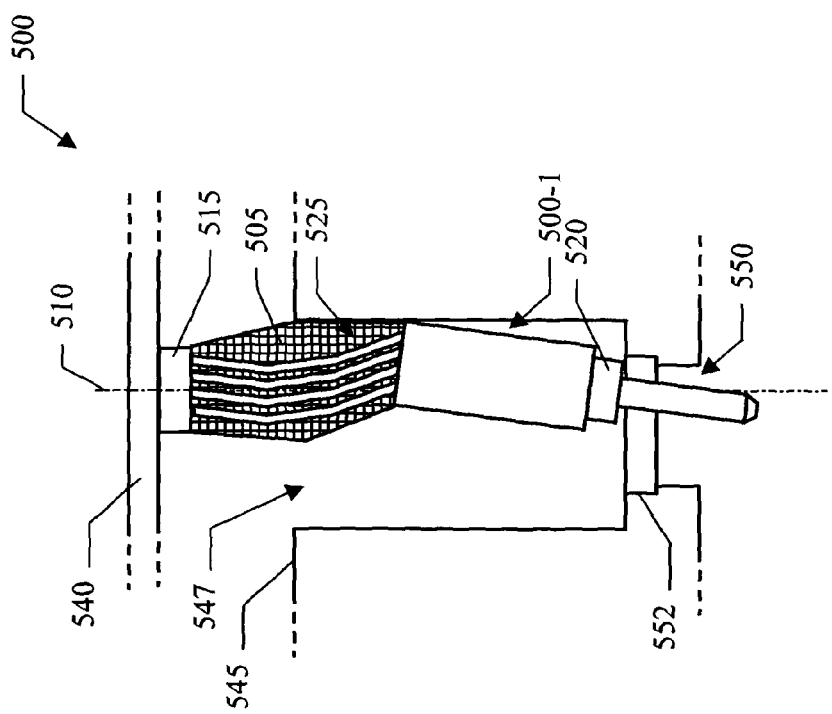

The needle of the tip 520 is free to slide through the hole 550, with the interference of the platform of the tip 520 with the spot-facing 552 that substantially maintains it aligned with the axis 510. However, as soon as the platform of the tip 520 exits the spot-facing 552, as shown in FIG. 5C, it can tilt; for example, this happens after a predefined deformation of the elastic core 505 between approximately 0.1% and 50%, for example between approximately 0.5% and 40% (such as approximately 5%). In this way, the columns 525 are now subject to a compression force with a tangential component, which remarkably facilitates their buckling; indeed, it is enough that the tangential compression force reaches $1/160$ of the critical load of the columns 525 to obtain their buckling. In this way, it may be possible to use columns 525 far larger (and therefore with higher electrical conductivity), nevertheless obtaining their buckling in the normal operative condition of the contact 500. Moreover, the tilt of the tip 520 exerts a scrubbing action in a possible native oxide layer that forms naturally on a corresponding terminal to be contacted electrically (so as to improve their electrical connection); such scrubbing is obtained in an accurate and controllable way (by suitably designing the relevant components of the contact 500). Particularly, the thickness of the spot-facing 552 defines the minimum deformation of the elastic core 505 being required to obtain the scrubbing. Moreover, the length of the tip 520, the thickness of the hole 550, the thickness of the spot-facing 552, the length of the hole 550 (along the scrubbing direction) and the width of the hollow 547 define the maximum range for the scrubbing. The direction of the hole 550 and of the spot-facing 552 instead define the direction along which the scrubbing occurs; for example, this allows making selective scrubbings along different directions for each contact (according to the arrangement of the corresponding terminals to be contacted). In an extreme case, whenever the tip of the basic module should be completely free to tilt inside the bush, this result may be achieved by omitting the lower disc of the shell completely.

Passing now to FIG. 6, there is schematically shown an electronic component 600 according to an embodiment. Particularly, the electronic component 600 is made in a chip of semiconductor material 605; several (analogue and/or digital) circuits 610 are integrated in the chip 605. A plurality of contacts 600-1 extend perpendicularly from an upper surface of the chip 605. Each contact 600-1 has a structure that is completely analogous to that of the contact being illustrated in FIG. 1A—i.e., with an elastic core 605, a pad 615, a tip 620, and multiple columns 625. In this case, the pad is integrated directly in the chip 605 (for example, it is made by a contact region with high dopant concentration).

An embodiment allows making contacts of the elastic type (for connecting the chip 605 to a substrate of a package with reduced mechanical stresses), which are integral with the chip 605. The same embodiment may also be used to interconnect different electronic components in a multi-chip module.

Alternatively, the contacts 600-1 may also have different heights. For example, this electronic component 600 may be used to contact power components on a DCB plate. In this case, the circuits 610 implement a control logic of the power components; the contacts 600-1 connect the control logic to the different devices being mounted on the DCB plate and to the DCB plate itself, thereby compensating their different heights automatically.

Moreover, in case the contacts 600-1 are made on the lower surface of the plate 605 as well, it is possible to form multi-dimensional structures (wherein more electronic components are stacked to each other).

The various phases of a production process for making the above-described contacts according to an embodiment are shown in FIG. 7A-7K.

Figure 7B:
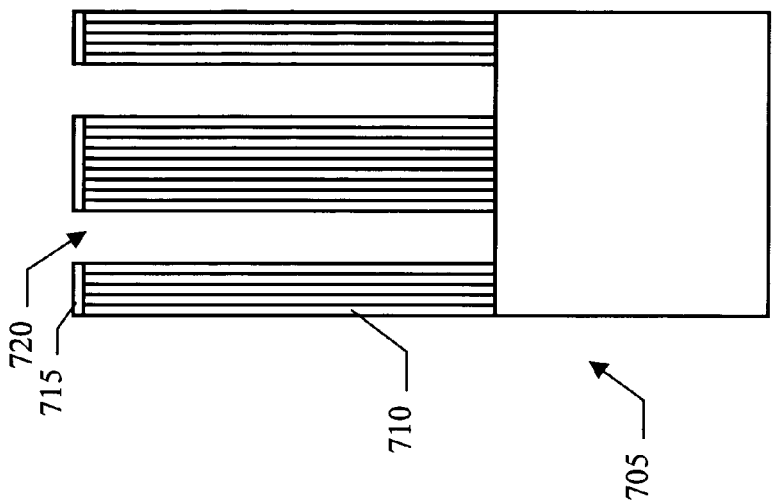
FIG. 7A-7K show the various phases of a production process for making a contact according to an embodiment.
Figure 7A:
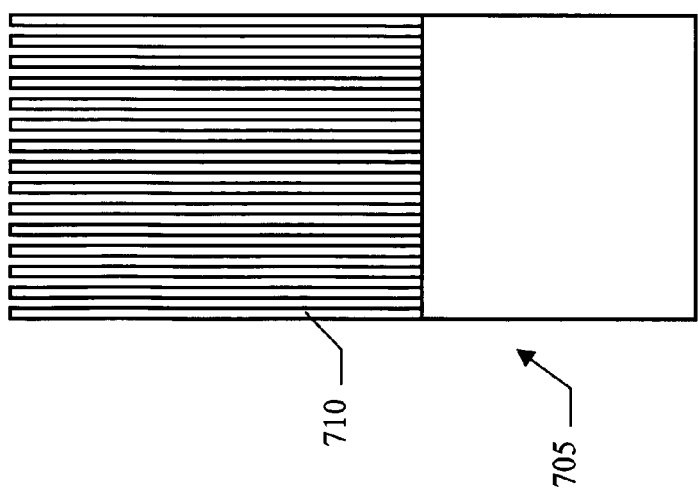
Figure 7D:
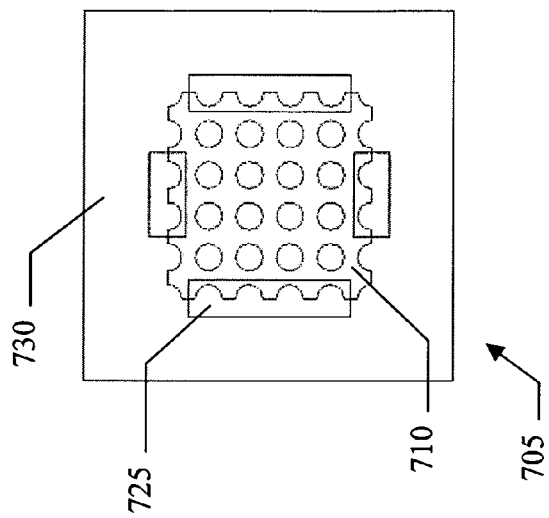

With reference in particular to FIG. 7A, the production process starts with a silicon wafer 705 (for example, of mono-crystalline type), wherein completely identical contacts are made at the same time in large number (for the sake of simplicity of description, however, in the following reference will be made to only one of such contacts). The wafer 705 is treated so as to obtain a punctured layer 710, which includes blind holes (for the columns of the contact) that extend into the wafer 705 from an upper surface thereof. Several known techniques may be used to make the punctured layer 710 (with holes either of constant section or of variable section along their depth). For example, for this purpose it may be possible to form a porous silicon layer (PS)—of the macroPS type (with holes of diameter higher than approximately 50 nm) or of the mesoPS type (with holes of diameter between approximately 2 nm and 50 nm)—starting from N-type silicon, as described in "V. Lehmann, U. Grüning "The limits of macropore array fabrication" Thin Solid Films 297 (1997) 13-17" (the entire disclosure of which is herein incorporated by reference). The same result may also be achieved by starting from P-type silicon. For example, in a wafer with resistivity of 10 Ωcm, it may be possible to deposit a film of silicon nitrite (for example, with a thickness of approximately 0.11 μm), open windows in the silicon nitrite film by means of a suitable mask (for example, with a squared section with a side of approximately 2 μm, with a pitch of approximately 4 μm), anisotropically etch the silicon through such windows, and then form a layer of macroPS by using a solution HF:DMSO=10:46 with a current density that varies from a starting value of approximately 8 mA/cm$^2$ to a final value of approximately 7 mA/cm$^2$ in 6 hours, so as to obtain corresponding holes with a depth of approximately 200 μm; processes of this type (for obtaining holes with depths even higher than approximately 500 μm) are described in "V. Lehmann, S. Rönnebeck, J. Electrochem. Associates 1999, 146, 2968", "S. Lust, C. Lévy-Clément, J. Electrochem. Associates 2002, 149, C338", and "H. Föll, M. Christophersen, J. Cartensen, G. Hasse, Mater. Ski. Eng., R 2002, 39, 93" (the entire disclosures of which are herein incorporated by reference).

Passing to FIG. 7B, an oxide layer 715 is deposited on the wafer 705—for example, by Plasma Enhanced Chemical Vapor Deposition (PECVD) technique; the oxide layer 715 has a thickness such as to completely close the holes of the punctured layer 710 (for example, an oxide layer of approximately 1.5 μm is enough to close holes with a diameter of approximately 2.5 μm). A window (or more) corresponding to the elastic core of the contact is then opened in the oxide layer 715 by photolithographic and dry etching or wet etching technique. At this point, it is possible to selectively remove the punctured layer 710 with an anisotropic etching through the window in the oxide layer 715 (for example, by Deep Reactive Ion Etching, or Deep RIE technique), so as to obtain a corresponding groove 720 (or more). The groove 720 is filled up with an elastic polymer. In case the polymer is of the thermo-setting type, this result may be achieved with an operation of casting into the groove 720; in order to avoid the formation of air bubbles in the polymer, the casting operation may be performed with the wafer 705 being arranged on an ultrasound source (so as to facilitate the exit of the bubbles), or by having the casting operation followed by a vacuum degassing operation. Alternatively, in case the polymer is of the thermo-plastic type, this result may be achieved by heating the polymer up to its transition temperature to the viscous state, and then pressing it into the groove 720.

Figure 7C:
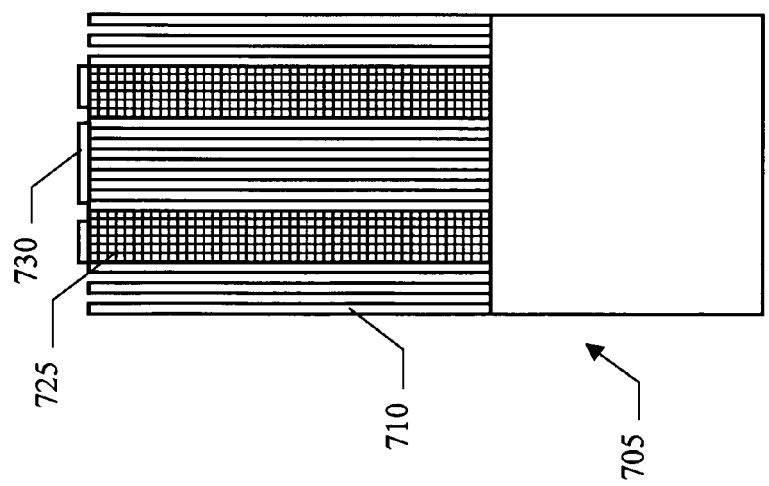

In both cases, once the polymer has become solid, there is executed a lapping operation—for example, of Chemical Mechanical Polishing (CMP) type—in order to remove the excess of polymer from the wafer 705. As shown in FIG. 7C, the lapping operation removes the polymer and the oxide layer down to the level of the punctured layer 710, so as to obtain a polymeric structure 725 that forms the elastic core of the contact. A metallic film 730 (for example, with a thickness of 2 µm) is made on the wafer 705—for example, by a thin film deposition operation being followed by a chemical and/or electrochemical deposition; the metallic film 730 is then patterned by photo-lithographic technique so as to close all the holes of the punctured layer 710 within the polymeric structure 725, but leaving free an inner edge portion of the polymeric structure 725 and an outer edge portion of the punctured layer 710 being enclosed by the polymeric structure 725 (for example, as shown in the phantom top view of FIG. 7D—wherein the only parts that are actually visible are the inner edge portion of the polymeric structure 725 and the outer edge portion of the punctured layer 710 being left exposed by the metallic film 730).

Figure 7F:
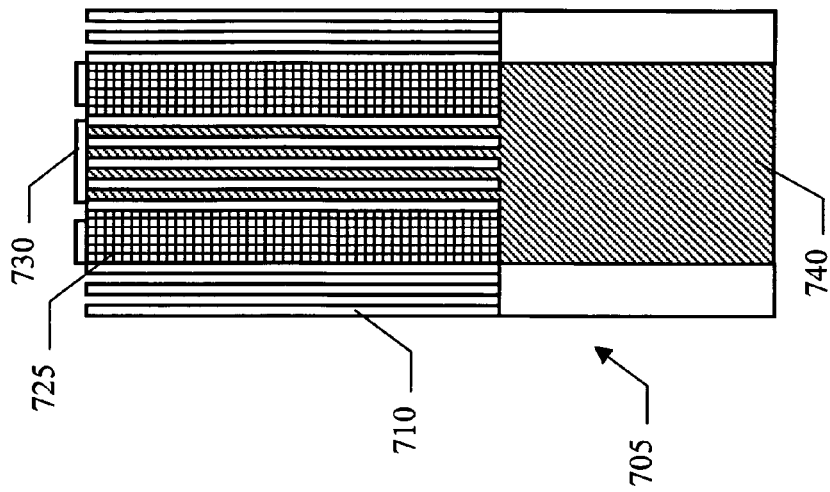
Figure 7E:
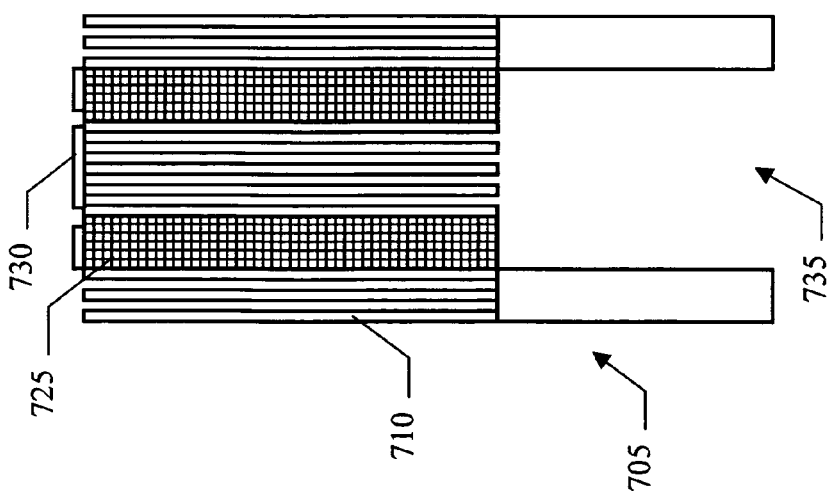

With reference now to FIG. 7E, a bore 735 is made into the wafer 705; the bore 735 extends from a lower surface of the wafer 705 until reaching the punctured layer 710; the bore 735 is aligned with an outer edge of the polymeric structure 725 (for example, by the known technique of Double Side Alignment Lithography). This result may be achieved by an etching operation with Deep RIE technique; the Deep RIE technique has a selectivity between the photo-resist material and the silicon of the order of approximately 100:1, so that a corresponding mask having a thickness of approximately 2-3 µm is enough to dig a bore 735 with a depth of approximately 200-300 µm.

Passing to FIG. 7F, a metal (for example, copper, nickel, gold, silver or platinum) is deposited into the holes of the punctured layer 710 (within the polymeric structure 725) and into the bore 735; this result is achieved by using the metallic film 730 as a cathode terminal of an electro-galvanic cell. The metal is then planarized to the level of the lower surface of the wafer 705 (by a lapping operation), so as to obtain a metallic structure 740. In particular, the portion of the metallic structure 740 in the punctured layer 710 defines the columns of the contact (which will have a constant or variable section according to the corresponding holes of the punctured layer 710).

Figure 7H:
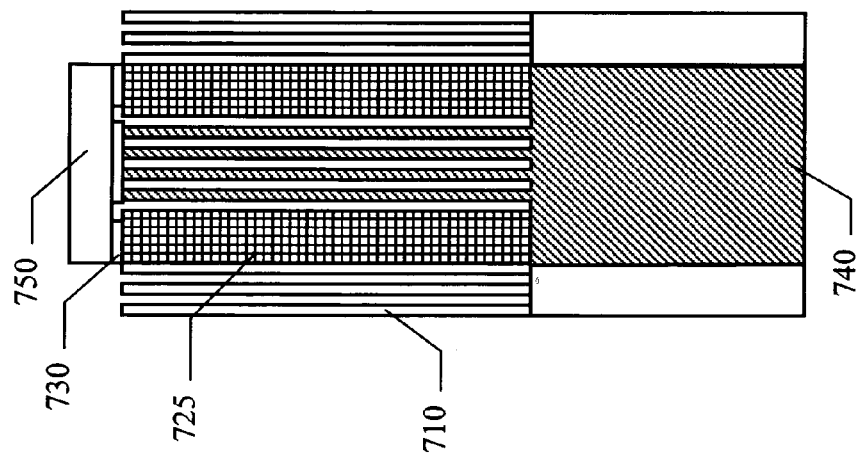
Figure 7G:
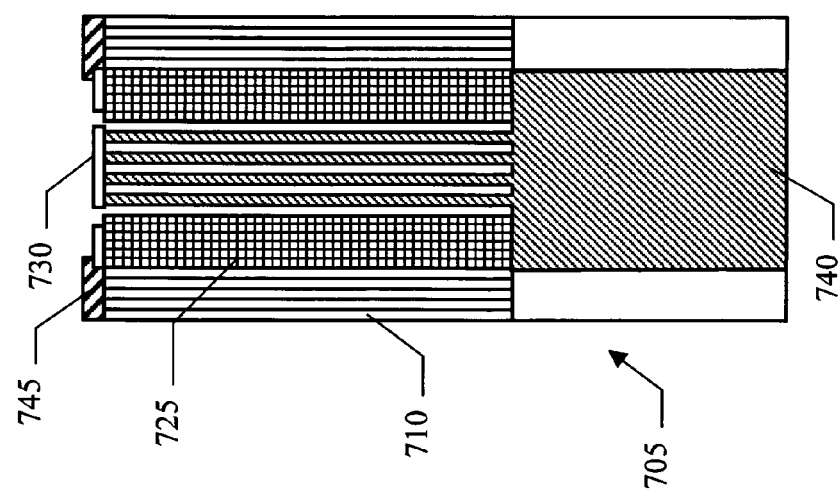

The process continues to FIG. 7G, wherein a photo-resist mask 745 is made on the wafer 705 by photolithographic technique, so as to protect the portion of the punctured layer 710 outside the polymeric structure 725. A selective etching being effective on the silicon but not on the metal and the photo-resist (for example, in vapor phase of XeF2) is used to remove the punctured layer 710 through the window in the metallic film 730; this operation clears the columns of the metallic structure 740 (inside the elastic core being defined by the polymeric structure 725).

At this point, as shown in FIG. 7H, the photo-resist layer is removed. A further metallic layer 750 is then deposited on the metallic film 730 (for example, by thick film or thin film techniques), so as to close the polymeric structure 725 at the top. The metallic layer 750 may be made of copper, and it may be coated with a thin layer of another metal that facilitates its bonding—for example, nickel, gold, or rhodium or ruthenium in case of connection with mechanical pressure only. In this way, the metallic layers 730,750 define the (pad-like) upper terminal of the contact.

The lower portion of the metallic structure 740 instead defines the base of the (tip-like) lower terminal of the contact. The production process then continues to FIG. 7I, wherein a thick photo-resist mask 755 (for example, up to approximately 300-400 µm with a photo-resist of SU8 type) is formed on the lower surface of the wafer 705, so as to leave exposed a central portion of the metallic structure 740 only. A metallic layer (or more) 760—for example, of copper, nickel, palladium cobalt, palladium nickel, gold or platinum—is then deposited on the exposed portion of the metallic structure 740 with the same thickness of the mask 755, so as to form the needle of the tip of the contact. The metallic layer 760 may also be planarized to the level of the mask 755 (by a lapping operation).

Figure 7J:
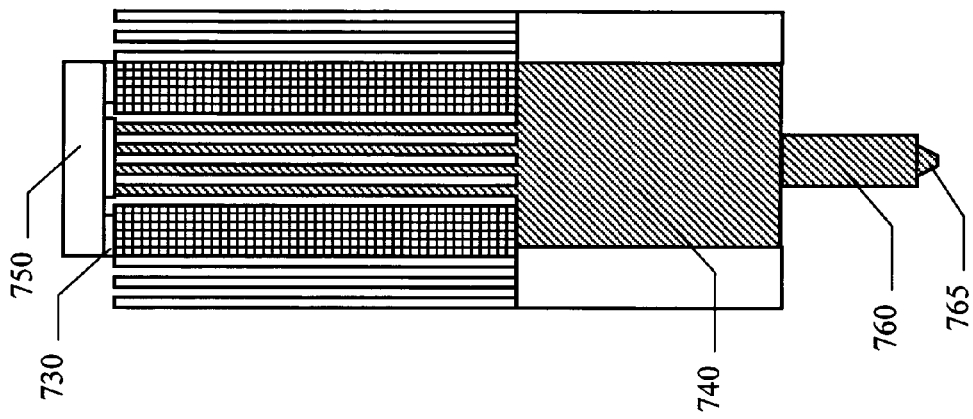
Figure 7I:
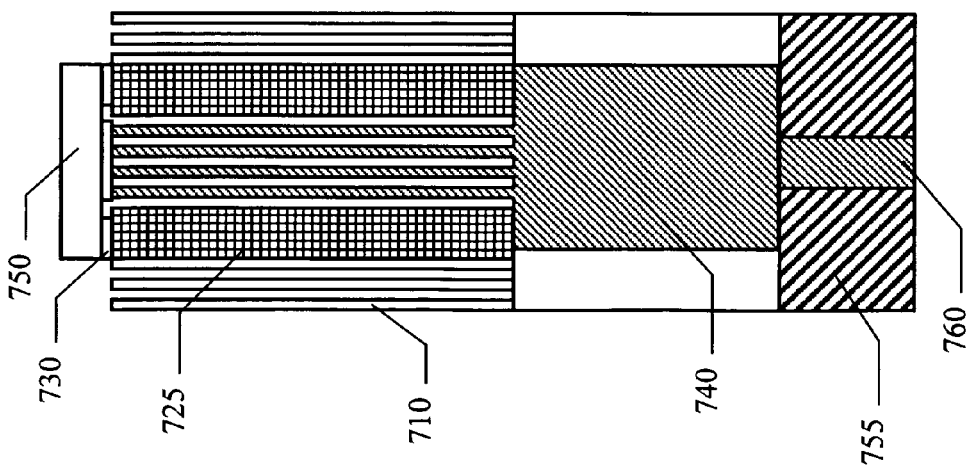

In any case, as shown in FIG. 7J, the photo-resist mask is removed. If it is necessary, it may then be possible to bond a button 765 onto the free end of the metallic layer 760. The button 765 is made of a material that is harder than the one of the metallic layer 760 (for example, palladium cobalt, rhodium, ruthenium or palladium nickel). Such button 765 may be made in whatever desired shape starting from a sacrificial wafer, wherein corresponding recesses are made (by photo-lithographic and dry or wet etching techniques), and then depositing the desired metal within such recesses.

Figure 7K:
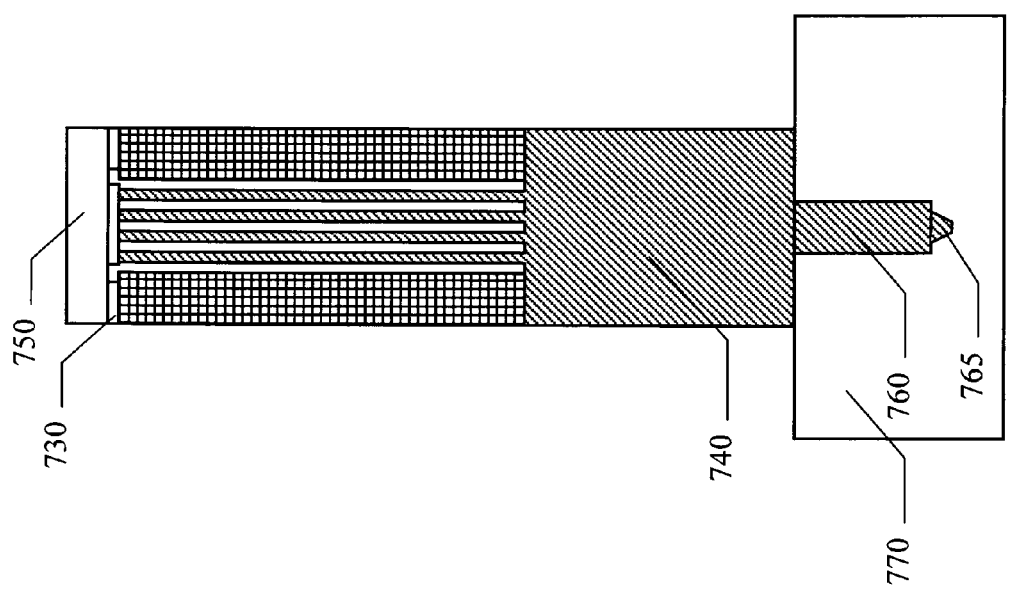

With reference now to FIG. 7K, the needle 760 (with the possible button 765) is embedded into a rigid support 770 (for example, of thermo-plastic material being heated at the moment of insertion of the needle 760 and then cooled). The remaining part of the wafer, including its punctured layer, is then removed with a selective etching operation (for example, in vapor of XeF2), so as to obtain the desired contact (for example, the contact 100 of FIG. 1A).

Alternatively, the same production process described above may be used with some changes to make contacts of different type. For example, returning to FIG. 7H, if the production process is stopped at this point (by directly removing the silicon part as above, after embedding the pad 750 into a rigid support, not shown in the figure), it may be possible to obtain a contact wherein the lower portion of the metallic structure 740 implements the corresponding terminal of the contact. For example, in this way, it may be possible to obtain a contact with both the terminals that are pad-shaped (by suitably regulating the thickness of the lower portion of the metallic structure 740 through the initial thickness of the wafer 705), which may be used as intermediate basic module in a contact with multiple basic modules in series (like the basic module 400-1b in FIG. 4C). The same operations also allow obtaining a contact with the tip at constant section (in case the thickness of the lower portion of the metallic structure 740 is higher).

Figure 8B:
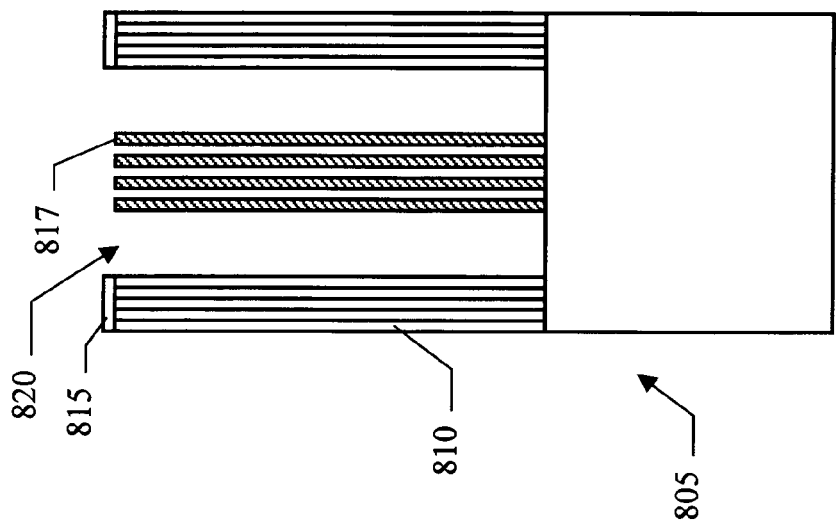
FIG. 8A-8C show the various phases of a production process for making a contact according to another embodiment.
Figure 8A:
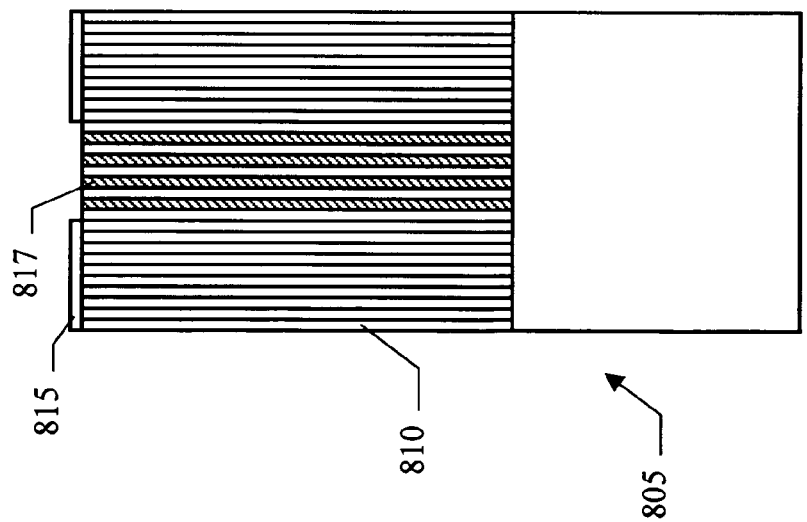
Figure 8C:
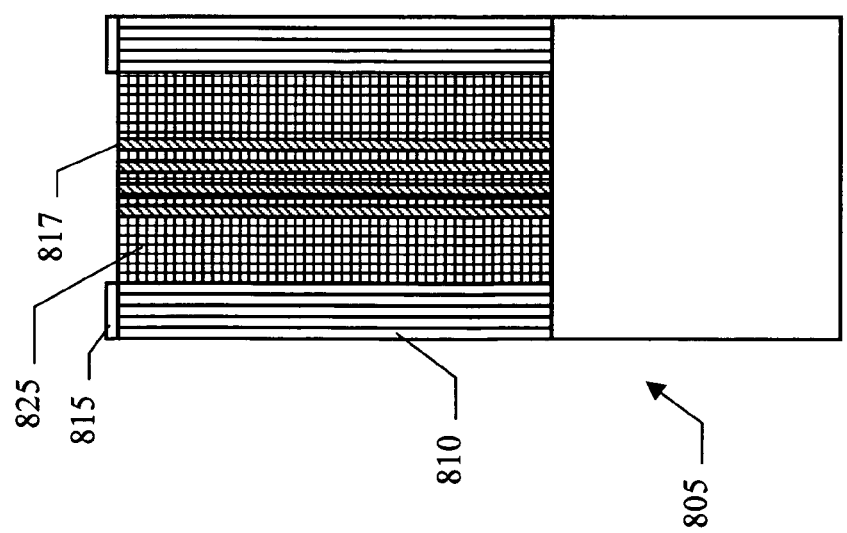

The various phases of a production process for making the above-described contacts according to a different embodiment are shown in FIG. 8A-8C.

With reference in particular to FIG. 8A, a wafer 805 is treated as above to obtain a punctured layer 810, and an oxide layer 815 is deposited on the wafer 805 so as to close the holes of the punctured layer 810 completely. A window (or more) is likewise opened in the oxide layer 815; in this case, however, the window is opened in correspondence to the columns of the contact. A metal (for example, copper, nickel, gold, silver or platinum) is deposited into the holes of the punctured layer 810 through the window in the oxide layer 815—for example, as described in Yukio H. Ogata, ET to. "Electrochemical metal deposition on silicon" Solid Been & Materials Science 10 (2006) 163-172 (the entire disclosure of which is herein incorporated by reference); in this way, there are obtained the columns of the contact (denoted with 817).

Passing to FIG. 8B, the window in the oxide layer 815 is enlarged (again by photo-lithographic and dry or wet etching technique) in correspondence to the whole elastic core of the contact (including the columns 817 inside it). At this point, it may be possible to remove as above the punctured layer 810 through the window in the oxide layer 815 (including that between the columns 817 being already formed), so as to obtain a corresponding groove 820 (or more).

As shown in FIG. 8C, the groove 820 is likewise filled up with an elastic polymer that is then planarized to the level of the punctured layer 810; in this way, there is obtained a polymeric structure 825 that forms the elastic core of the contact, which now embeds the columns 817 completely. The production process of the contact then continues exactly as described above.

The various phases of a production process for making the above-described contacts according to another embodiment are shown in FIG. 9A-9H.

Figure 9B:
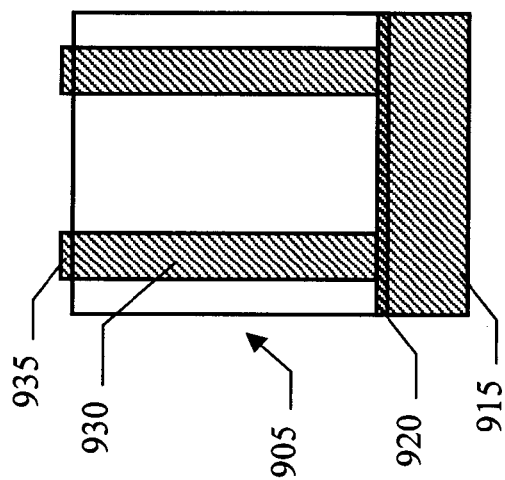
FIG. 9A-9H show the various phases of a production process for making a contact according to a further embodiment.
Figure 9A:
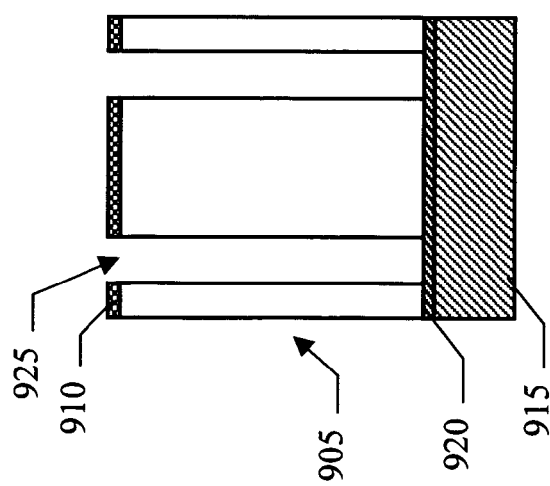

With reference in particular to FIG. 9A, the production process begins with a silicon wafer 905. An oxide layer 910 is grown on the wafer 905. A window corresponding to the bush of the contact is opened in the oxide layer 910 (for example, by photo-lithographic and plasma etching technique). The wafer 905 is then glued onto a conductive rigid substrate 915 (for example, of metal), through a conductive adhesive layer 920. A groove 925 extending from an upper surface of the wafer 905 up to reach the adhesive layer 915 is dug into the wafer 905, by an etching operation through the window in the oxide layer 910. For example, for this purpose a Deep RIE technique is used, which allows making grooves with a width-depth relationship of the order of approximately 1:100—so that, it may be possible to obtain grooves with a depth of approximately 700 μm only with a width of approximately 7 μm. The same result may also be achieved by using a photo-resist mask (instead of the oxide layer 910), since the Deep RIE technique has a selectivity between the photo-resist and the silicon of the order of approximately 1:100 (so that a mask having a thickness of approximately 2-3 μm is enough to dig grooves with a depth of approximately 200-300 μm).

Continuing to FIG. 9B, the oxide layer is removed. A metal (for example, copper, nickel, gold, silver or platinum) is deposited into the groove (by using the metallic substrate 915 and the adhesive layer 920 as cathode terminal of an electro-galvanic cell). The metal is then planarized to the level of the upper surface of the wafer 905 (by a lapping operation), so as to obtain a metallic structure 930 that forms the bush of the contact. A metallic film 935 being easily solderable by thermo-compression (for example, gold) is further deposited by electro-galvanic technique on an exposed surface of the metallic structure 930.

The process continues to FIG. 9C, wherein the substrate with the respective adhesive layer is removed from below the wafer 905. An analogous conductive rigid substrate 940 is now glued on top of the wafer by means of a conductive adhesive layer 945. As above, a metallic film 950 being easily solderable by thermo-compression (for example, gold) is deposited on a new exposed surface of the metallic structure 930. In this case, the substrate 940 and the adhesive layer 945 may also be non-conductive, when the metallic layer 950 is deposited by thin film technique—for example, sputtering.

Figure 9D:
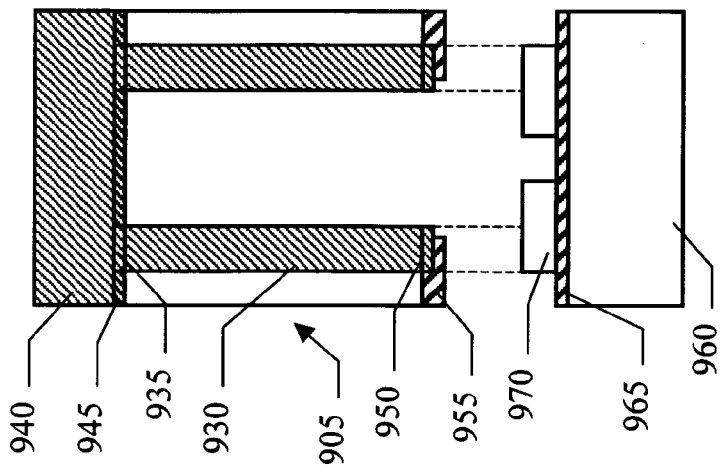
Figure 9C:
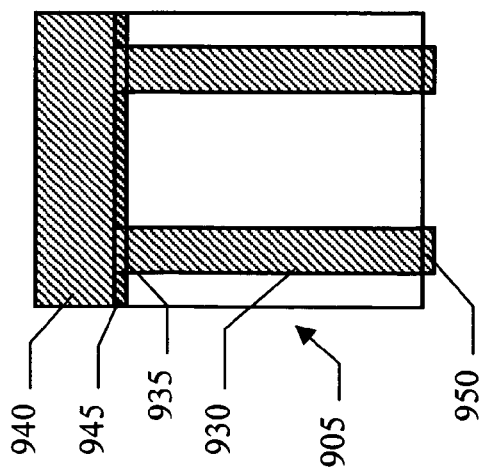

With reference now to FIG. 9D, a photo-resist mask 955 is made under the wafer 905 by photolithographic technique, so as to leave exposed the portion of the wafer 905 within the metallic structure 930. A selective etching being effective on the silicon but not on the metal and the photo-resist (for example, in vapor-phase of XeF2) is used to remove all the silicon within the metallic structure 930. An insulating film (not shown in the figure) at this point is deposited on the inner (cleared) surface of the metallic structure 930; for example, this insulating film may consist of Diamond Like Carbon (DLC), being deposited by thin film technique with a thickness of approximately 100-200 nm. At this point, there is provided a further wafer of Silicon On Insulator (SOI) type, which is formed by a silicon substrate 960, a buried silicon dioxide layer 965, and an active silicon layer 970 (for example, with a thickness from approximately 10 nm to 100 μm) being stacked together. The silicon layer 970 has been previously patterned (for example, by plasma etching technique) so as to obtain a structure that defines the lower disc of the shell. An analogous insulating film (not shown in the figure) is deposited as above on the silicon layer 970 (for example, DLC being deposited by thin film technique with a thickness of approximately 100-200 nm), with the exception of the region corresponding to the metallic layer 950.

Passing to FIG. 9E, the substrate with the respective adhesive layer are removed from above the wafer 905, and the mask is removed from below the wafer 905. The SOI wafer 960-970 is then aligned with the wafer 905, and the metallic layer 950 is soldered to the silicon layer 970 (for example, by exploiting the gold-silicon eutectic that forms at a temperature of 363° C.).

Figure 9F:
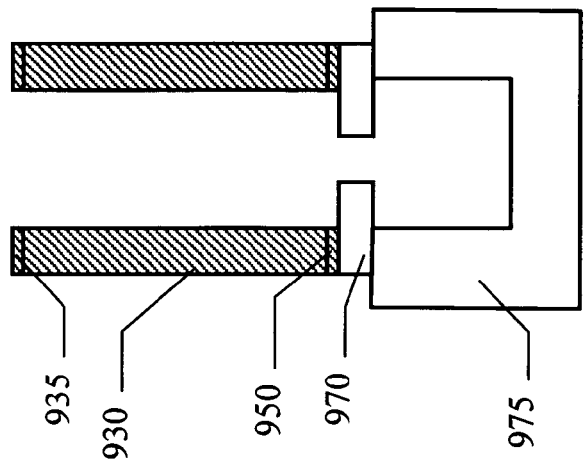
Figure 9E:
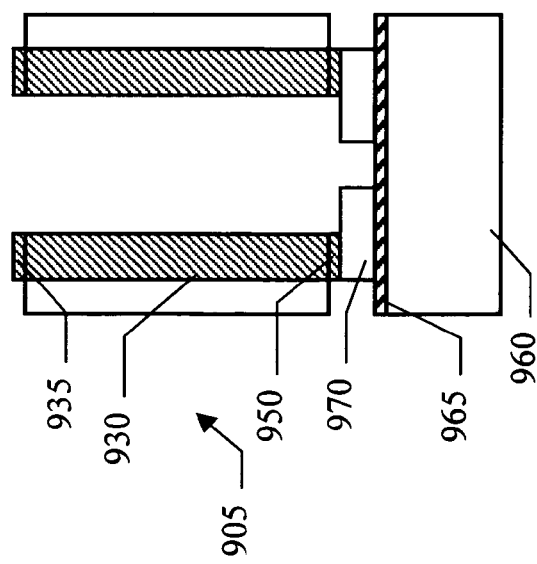

At this point, as shown in FIG. 9F, the oxide layer of the SOI wafer is removed (for example, in a vapor-phase or wet solution of HF) so as to release the corresponding substrate. A rigid support 975 with a bore in correspondence to the metallic structure 930 (for example, of plastic or glass) is glued under the wafer. An etching of the isotropic type or of the selective type (being effective on the silicon but not on the metal—for example, in vapor-phase of XeF2) is used to remove the remaining part of the wafer.

Figure 9H:
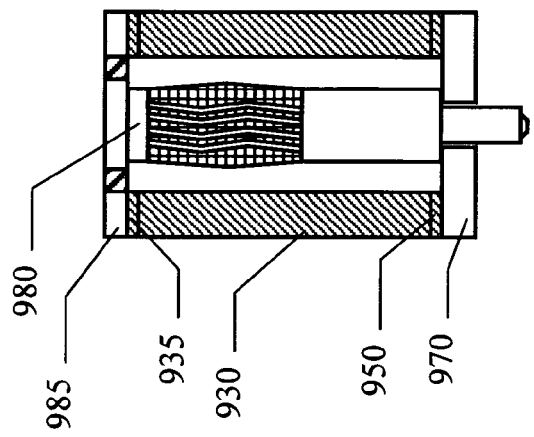
Figure 9G:
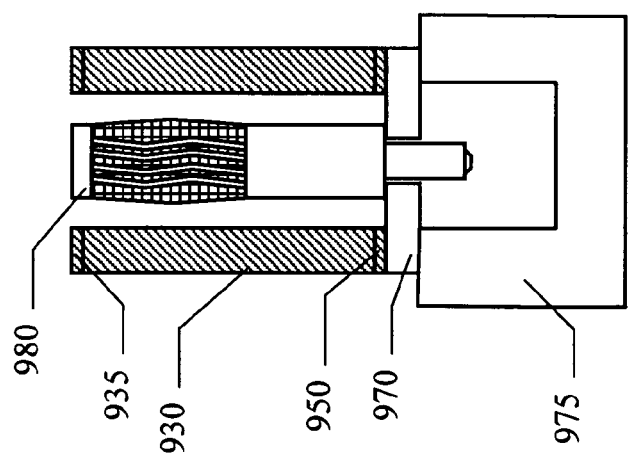

The process continues to FIG. 9G, wherein a basic module 980 (with a structure that is completely analogous to that of the contact being illustrated in FIG. 1A) is inserted from the top into the metallic structure 930; for this purpose, there is used a pick-and-place technique, which provides a typical accuracy of ±0.5 μm at 3σ.

At the end, as shown in FIG. 9H, a substrate 985 that makes the upper disc of the shell (with a conductive portion corresponding to the pad-like upper terminal of the basic module 980 and a conductive portion corresponding to the metallic layer 930, being suitably insulated to each other) is connected on top of the basic module 980 and the metallic structure 930. At this point, the rigid support can be removed so as to obtain the desired contact.

Alternatively, the same result may be achieved (from the structure of FIG. 9F), by connecting the basic module directly to the upper disc, and inserting the structure so obtained into the bush of the shell. Particularly, this procedure may be used when the lower disc of the shell is lacking (i.e., the phase of connecting the SOI wafer is omitted), so as to obtain a contact with the tip of the basic module that is completely free to bend.

Naturally, in order to satisfy local and specific requirements, one may apply to one or more embodiments described above many logical and/or physical modifications and alterations. More specifically, although one or more embodiments have been described with a certain degree of particularity, it is understood that various omissions, substitutions and changes in the form and details as well as other embodiments may be possible. Particularly, different embodiments may even be practiced without the specific details (such as the numerical examples) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment of the disclosed solution may be incorporated in any other embodiment as a matter of general design choice.

Particularly, similar considerations apply if the contact has a different structure or includes equivalent components; moreover, the components may be either separate to each other or combined together, in whole or in part.

For example, each component of the contact may have any shape and/or size, and it may be made of any other material. Particularly, the above-mentioned exemplary size (for a single contact) may be greater in case of coaxial structures or in case of interposer. For example, it may be possible to have a square, rectangular, elliptic elastic core, terminal elements with corresponding shape (pad-, tip-, pyramid-, ball-, toroidal-segment-like—either equal or different to each other), columns with square, rectangular, elliptic (either solid or hollow) section. Any number of columns (or equivalent elements) may be provided (down to a single one); moreover, the columns may be arranged in any other position between the contact terminals being opposite to each other axially.

Similar considerations may apply if the elastic core has a different characteristic curve.

Likewise, whatever number of through-holes may be made in the elastic core, each one for housing whatever number of columns (down to a single one); moreover, the columns may have any other arrangement within the respective hole (also in contact among them and/or with the sidewall of the hole). In any case, combined structures (with some columns being embedded in the elastic core and other ones being free) are not excluded.

Nothing prevents making coaxial structures with more inner holes and/or more ring-shaped hollow spaces (even being not continuous), and then more groups of inner columns and/or outer columns; moreover, the inner portion and the outer portion of the elastic core may have different shape (for example, with circular section and rectangular section, respectively).

The pre-deformation of the elastic core may be obtained with equivalent means (for example, by dedicated tie rods), and it may take other values. However, this characteristic is not strictly necessary, and it may be omitted in some implementations of the contacts.

Other techniques may be used to reduce the critical load of the columns (for example, by creating structural imperfections along them); clearly, nothing prevents using columns that are completely uniform.

Any number of basic modules may be connected in series among them (so as to obtain a contact of either single tip type or double tip type); moreover, the same embodiment may also be applied to a contact being not inserted in any rigid shell.

Similar considerations may apply if the shell has a different structure or includes equivalent components; moreover, the components may be either separate to each other or combined together, in whole or in part. Moreover, each component of the shell may have any shape and/or size, and it may be made of any other material (for example, without interfering in any way with the deformation of the elastic core).

Alternatively, the tip of the contact (and the corresponding opening in the disc of the rigid shell) may have any other tapered shape (for example, pyramidal or conical one) and the corresponding opening may be shaped in any other way in order to allow the tip to tilt after any other predefined deformation. In any case, nothing prevents only allowing axial translations of the tip, or leaving the tip completely free.

The above-mentioned applications of the proposed contact are merely indicative and non-exhaustive; for example, the same structure may be used to make any other electronic component (like an interposer). In any case, it is apparent that the proposed structure might be part of the design of an integrated circuit. The design may also be created in a programming language; moreover, if the designer does not manufacture the chips or the masks, the design may be transmitted by physical means to others. In any case, the resulting integrated circuit may be distributed by its supplier in raw wafer form, as bare die, or in packages. Moreover, the proposed structure may be integrated with other circuits in the same chip, or it may be mounted in intermediate products (such as mother boards) and coupled with one or more other chips (such as a controller, such as a processor, and a memory). In any case, the electronic component may be suitable to be used in complex systems (such as computers).

The above-described embodiments of the production process of the contact are merely illustrative and in no way limitative. Particularly, the same result may be achieved with equivalent processes (by using similar steps, removing some steps being non-essential, or adding further optional steps); moreover, the steps may be performed in a different order, concurrently or in an interleaved way (at least in part). For example, the holes in the wafer may be made with Deep RIE technique, as described in "F. Marty et al. "Advanced etching of silicon based on deep reactive ion etching for silicon high aspect ratio microstructures and three-dimensional micro and nanostructures" Microelectronics Journal 36, Issue 7 (2005) 673-677" (the entire disclosure of which is herein incorporated by reference). Alternatively, it may be possible to exploit a layer of porous alumina being obtained with anodization technique of an aluminum plate, as described in "Woo Lee, et al., "Fast fabrication of long-range ordered porous alumina membranes by hard anodisation" Materials Natures, 5 (2006) 741-747" (the entire disclosure of which is herein incorporated by reference). Moreover, the columns may be made of carbon nanotubes—for example, as reported in Shoso Shingubara, "Fabrication of nanomaterials using porous alumina templates" Journal of Nanoparticles Reserch 5, (2003), 17-30 (the entire disclosure of which is herein incorporated by reference).

Likewise, the shell may be made with other processing techniques of MicroElectroMechanical Systems (MEMS), with molding or micro-molding techniques, with micro-processing techniques by means of numerical control machines (such as boring mills, cutters, and laser-drills).

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. An elastic contact device for electrically contacting electronic components, wherein the contact device includes at least one basic module having a longitudinal axis, each basic module including:
   an elastic core for defining an elasticity of the basic module, the elastic core undergoing an axial elastic deformation in response to an axial compression;
   a first contact terminal element and a second contact terminal element coupled with the elastic core in axially opposed positions; and at least one elongated contact element extending axially between the first terminal element and the second terminal element;

wherein each elongated element is configured to have a buckling axial critical load higher than zero for self-sustaining in absence of external forces during a production of the basic module and lower than a threshold compression for buckling thereby not contributing to the elasticity of the basic module during operation thereof, the threshold compression corresponding to a threshold deformation of the elastic core with respect to a rest condition of the elastic core ranging between 0.1% and 50%.

2. The contact device according to claim 1, wherein the elastic core includes at least one axial through-hole with a lateral surface, and wherein the at least one elongated element includes a plurality of columns within each hole, the columns being spaced apart from each other and from the lateral surface.

3. The contact device according to any claim from 1, further including means for pre-deforming the elastic core.

4. The contact device according to claim 1, wherein the at least one elongated element has an axially variable structure for reducing the critical load.

5. The contact device according to claim 1, wherein the at least one basic module includes a plurality of basic modules being axially aligned in a sequence with the second terminal element of each basic module connected to the first terminal element of a next basic module in the sequence, the first terminal element of a first basic module in the sequence and the second terminal element of a last basic module in the sequence defining a first terminal element and a second terminal element of the contact device, respectively.

6. An electronic component including a chip of semiconductor material having a first main surface and a second main surface opposite to each other, an electronic circuit integrated in the chip, and a plurality of contact devices according to claim 1 projecting from at least one between the first main surface and the second main surface, the first terminal element of each contact device being integrated in the chip.

7. The contact device according to claim 1, wherein the elastic core has a non-linear elastic characteristic.

8. The contact device according to claim 7, wherein the at least one hole includes at least one internal hole and at least one external hole embedding the at least one internal hole.

9. The contact device according to claim 1, further including a rigid element for housing the at least one basic module, the rigid element having a section larger than a section of the elastic core of the at least one basic module for allowing the deformation thereof, a first base coupled with the first terminal element of the contact device, and a second base coupled with the second terminal element of the contact device, at least one between the first base and the second base having an opening and each corresponding terminal element comprising a contact tip sliding through the opening for projecting from the rigid element.

10. The contact device according to claim 9, wherein each tip has a tapered structure narrowing outwardly and each opening has a section matching the corresponding tip for driving the tip along the axis up to a further threshold deformation of the elastic core and for allowing the tip to tilt with respect to the axis after the further threshold deformation.

11. A method for electrically contacting electronic components by means of an elastic contact device including at least one basic module having a longitudinal axis, for each basic module the method including:

providing an elastic core for defining an elasticity of the basic module;

providing a first contact terminal element and a second contact terminal element coupled with the elastic core in axially opposed positions; and providing at least one elongated contact element extending axially between the first terminal element and the second terminal element;

wherein applying an axial compression to the elastic core to cause an axial elastic deformation thereof, the axial compression being higher than a threshold compression corresponding to a threshold deformation of the elastic core with respect to a rest condition of the elastic core ranging between 0.1% and 50%, each elongated element being configured to have a buckling axial critical load higher than zero for self-sustaining in absence of external forces during a production of the basic module and lower than the threshold compression for buckling thereby not contributing to the elasticity of the basic module during operation thereof.

12. A method for producing an elastic contact device for electrically contacting electronic components, wherein the contact device includes at least one basic module having a longitudinal axis, for each basic module the method including:

forming an elastic core for defining an elasticity of the basic module, the elastic core undergoing an axial elastic deformation in response to an axial compression;

forming a first contact terminal element and a second contact terminal element coupled with the elastic core in axially opposed positions; and forming at least one elongated contact element extending axially between the first terminal element and the second terminal element;

wherein each elongated element is configured to have a buckling axial critical load higher than zero for self-sustaining in absence of external forces during the production of the basic module and lower than a threshold compression for buckling thereby not contributing to the elasticity of the basic module during operation thereof, the threshold compression corresponding to a threshold deformation of the elastic core with respect to a rest condition of the elastic core ranging between 0.1% and 50%.

13. The method according to claim 12, wherein the step of forming at least one elongated contact element includes forming the at least one elongated contact element freely projecting from a support base.

14. The method according to claim 13, further including:

providing a chip of semiconductor material having a first main surface and a second main surface opposite to each other;

forming a punctured layer with at least one blind hole extending into the chip from the first main surface;

depositing a metal and/or growing carbon nanotubes into part of the punctured layer to obtain the at least one elongated element;

removing a portion of the punctured layer to obtain at least one groove extending into the chip from the first main surface, the groove clearing the at least one elongated element;

filling the groove with an elastic polymer to obtain the elastic core, forming a bore extending into the chip from the second main surface up to the at least one elongated element;

depositing a metal into the bore to obtain the second contact terminal element; and forming the first contact terminal element in contact with the at least one elongated element on the first main surface.

15. The method according to claim 13, further including:

providing a chip of semiconductor material having a first main surface and a second main surface opposite to each other;

forming a punctured layer with at least one blind hole extending into the chip from the first main surface;

removing a portion of the punctured layer to obtain at least one groove extending into the chip from the first main surface;

filling the groove with an elastic polymer to obtain the elastic core;

forming a bore extending into the chip from the second main surface up to the punctured layer;

depositing a metal into part of the punctured layer and into the bore to obtain the at least one elongated element and the second contact terminal element, respectively;

removing the punctured layer to clear the at least one elongated element; and forming the first contact terminal element in contact with the at least one elongated element on the first main surface.

16. The method according to claim 15, wherein the step of forming a punctured layer includes forming a layer of porous silicon in the chip.

17. The method according to claim 15, further including depositing a further metal onto a portion of the second contact terminal element to obtain a corresponding tip.

18. The method according to claim 17, further including bonding a button onto a portion of the tip, the button being harder than the tip.

* * * * *